(12) United States Patent
Gagnon et al.

(10) Patent No.: US 7,444,247 B2
(45) Date of Patent: Oct. 28, 2008

(54) SYSTEM AND METHOD FOR READING POWER METERS

(76) Inventors: Stephan Gagnon, 1605 Autoroute Laval Ouest, Ste 201A, Laval, Quebec (CA) H7L 3W3; Joseph Luc Boucher, 87 Inverkip Avenue, Ottawa, Ontario (CA) K1T 4B9; Maurice Tuff, 80 Castors Dr., St. John's, Newfoundland (CA) A1N 5K5

( * ) Notice: Subject to any disclaimer, the term of this patent is extended or adjusted under 35 U.S.C. 154(b) by 59 days.

(21) Appl. No.: 11/486,088

(22) Filed: Jul. 14, 2006

(65) Prior Publication Data

US 2007/0038394 A1    Feb. 15, 2007

Related U.S. Application Data

(63) Continuation-in-part of application No. 10/814,255, filed on Apr. 1, 2004, now Pat. No. 7,174,260.

(51) Int. Cl.
    G06F 17/00 (2006.01)
(52) U.S. Cl. .......................................... 702/60; 705/412
(58) Field of Classification Search .................. 702/60, 702/182–185, 188, 61–64, 59; 705/412; 324/500
    See application file for complete search history.

(56) References Cited

U.S. PATENT DOCUMENTS

| | | |
|---|---|---|
| 4,059,747 A | 11/1977 | Brody |
| 4,119,948 A | 10/1978 | Ward et al. |
| 4,204,115 A | 5/1980 | Boldridge, Jr. |
| 4,697,182 A | 9/1987 | Swanson |
| 4,803,632 A | 2/1989 | Frew et al. |
| 4,811,011 A | 3/1989 | Sollinger |
| 4,819,180 A | 4/1989 | Hedman et al. |
| 4,956,551 A | 9/1990 | Repschläger et al. |
| 5,056,107 A | 10/1991 | Johnson et al. |
| 5,214,587 A | 5/1993 | Green |
| 5,371,511 A | 12/1994 | Atherton, Jr. et al. |
| 5,635,895 A | 6/1997 | Murr |
| 5,644,139 A | 7/1997 | Allen et al. |
| 5,880,464 A | 3/1999 | Vrionis |
| 5,880,677 A | 3/1999 | Lestician |

(Continued)

FOREIGN PATENT DOCUMENTS

CA         2443987        10/2002

OTHER PUBLICATIONS

Pages from website—www.centameter.com/au/home.htm, printed Feb. 27, 2004.

(Continued)

Primary Examiner—Edward Raymond
(74) Attorney, Agent, or Firm—Adrienne M. Bieber McNeil; Bereskin & Parr

(57) ABSTRACT

Various embodiments are described herein for a housing for a detection unit that is used to read a power meter unit mounted on a structure that is consuming power. The power meter unit includes an indication with a cyclical property having a period that varies at a rate indicative of power consumption of the structure. Generally, the housing includes a main body for housing internal electronics, an extension member having a head region for housing at least a portion of the sensor unit, and an attachment means for mounting the main body on the power meter.

22 Claims, 14 Drawing Sheets

U.S. PATENT DOCUMENTS

| | | |
|---|---|---|
| 6,049,791 A | 4/2000 | Lerner |
| 6,369,719 B1 | 4/2002 | Tracy et al. |
| 6,424,270 B1 | 7/2002 | Ali |
| 6,476,592 B1 | 11/2002 | Humlum |
| 6,622,097 B2 | 9/2003 | Hunter |
| 6,956,500 B1 | 10/2005 | Ducharme et al. |
| 7,174,260 B2 | 2/2007 | Tuff et al. |
| 2002/0105435 A1 | 8/2002 | Yee et al. |
| 2003/0135338 A1 | 7/2003 | Knaus et al. |
| 2003/0193405 A1 | 10/2003 | Hunt et al. |
| 2004/0246143 A1 | 12/2004 | Crichlow |
| 2006/0103549 A1* | 5/2006 | Hunt et al. ............. 340/870.02 |

OTHER PUBLICATIONS

Pages from website—www.energymonitor.com—Energy Monitoring Technologies Inc., Miami, FL, printed Nov. 24, 2003.
Pages from website—www.nwextension.com—Northwest Extension Inc. Kirkland, Wa, pritned May 15, 2003.
International Search Report from PCT/CA2005/000473 dated Aug. 30, 2005.

\* cited by examiner

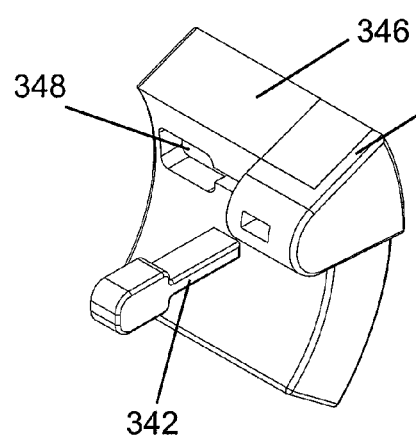
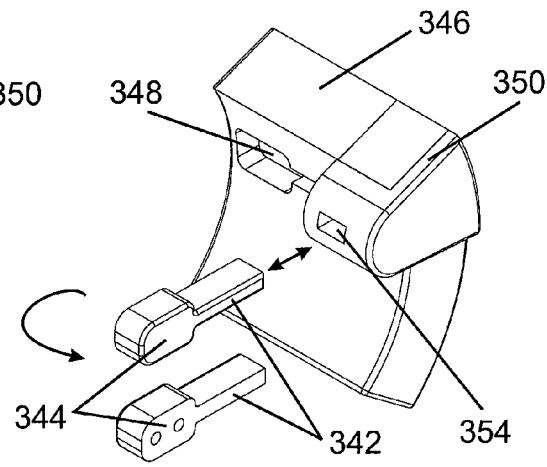
FIG. 12a  FIG. 12b
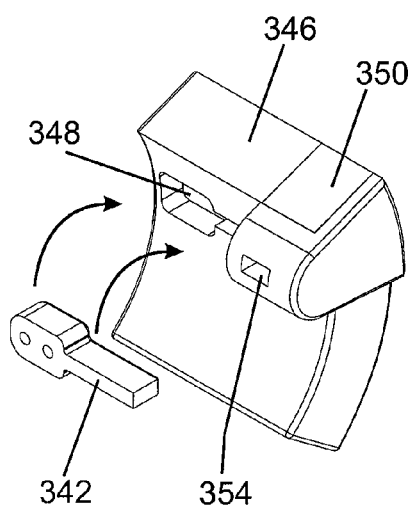
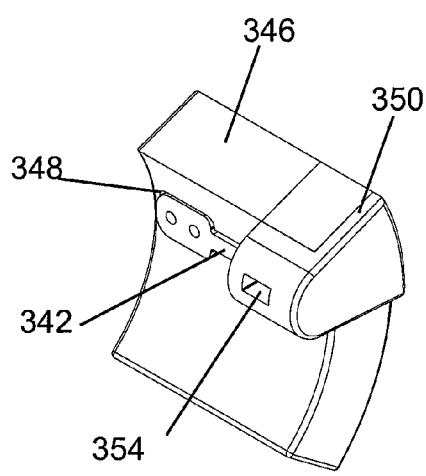
FIG. 12c  FIG. 12d

SYSTEM AND METHOD FOR READING POWER METERS

REFERENCE TO RELATED APPLICATION

This application is a continuation-in-part of U.S. patent application Ser. No. 10/814,255, filed on Apr. 1, 2004, now U.S. Publication No. 2005/0222784.

FIELD

Various embodiments described herein relate to a system and method for reading power meters a housing for a power meter reader.

BACKGROUND

Power meters are used by utility companies for measuring and providing a readout for the quantity of electricity that has been used in a commercial or residential establishment. Conventionally, if a person, such as a homeowner, wanted to monitor energy consumption, then the person would physically go outside to the location of the power meter to read the power meter. This process is labor intensive, can be subject to human error and in certain circumstances may not be safe for the person. Accordingly, there is a movement towards automatic power meter readers that integrate the capability of measuring the amount of electricity and communicating the measurement to the utility company using either wired or wireless signal transmission. However, automatic power meter readers are generally limited to newer power meter installations. Consequently, there is a need for a power meter reader that can be retrofitted to the various types of existing power meters.

Automatic power meter readers are typically retrofitted to existing power meters and are typically connected to the power lines power to obtain power. However, it would be more convenient to use one or more batteries for a power source; i.e. the automatic power meter reader would be easier to install since no connections to a power source would have to be made. Unfortunately, the operations that are carried out by the automatic power meter readers, such as detecting the rotation of the power meter disk and transmitting information related to power consumption of the structure are power hungry operations that would result in the frequent replacement of the batteries. This is inefficient and cumbersome. Accordingly, it would be advantageous to have a power meter reader that operates in an efficient manner for prolonging battery lifetime.

Another common issue for power utility companies is dealing with unsatisfied consumers who complain about their high electric bills. What is needed is technology that allows a consumer to know how much electricity they are consuming, in dollars and cents or kilowatt-hours, and how much their electric bill will be at the end of the month. The consumers can use the feedback on the amount of electricity that they are using to reduce high electric bills. There is also a growing pressure to increase energy efficiency, conserve energy resources and reduce atmospheric pollution. This can be achieved with increased consumer awareness of the amount of energy that they are consuming. In fact, studies show that energy savings of up to 15% or more is possible when consumers get enough information to make meaningful decisions about energy consumption.

In addition, there are various power meters currently on the market including older style meters with dials and a rotary power disk, and newer style meters with digital or other forms of output. The output may be oriented at various directions such as facing outwards toward the face of the power meter or facing outward towards the periphery of the power meter.

SUMMARY

In one aspect, at least one embodiment described herein provides an attachment means for attaching the detection unit to the power meter unit. The attachment means is adapted for allowing the detection unit to be attached to a wide variety of power meter units. In particular, the attachment means includes a clamping means that is fitted around the perimeter of the body of the power meter unit. The attachment means also includes an arm that houses at least a portion of the sensor unit for sensing the indication of power consumption of the power meter unit. The arm includes an extension means for extending the length of the arm so that the location of the sensors can be properly adjusted over an appropriate location on the power meter unit. The arm may also include a pivot means for angling the arm with respect to the main body of the detection unit.

In yet another aspect, at least one embodiment described herein provides a housing for a detection unit for automatically reading a power meter unit mounted on a structure that is consuming power. The power meter unit includes an indication with a cyclical property having a period that varies at a rate indicative of power consumption of the structure. The housing comprises a main body for housing internal electronics; an extension member connected to the main body, the extension member having a head region for housing a sensor unit; and, an attachment means connected to the main body for mounting the main body on the power meter unit.

In another aspect, at least one embodiment described herein provides a housing for a detection unit that is used to read a power meter unit mounted on a structure that is consuming power. The power meter unit including an indication with a cyclical property having a period that varies at a rate indicative of power consumption of the structure. The housing comprises a main body for housing internal electronics; an extension member releasably connected to the main body, the extension member having a head region for housing at least a portion of the sensor unit; and an attachment means connected to the main body for mounting the main body on the power meter. The extension member can be connected to the main body in one of a projected configuration, and a folded configuration to accommodate different power meter units having different locations for the indication.

In another aspect, at least one embodiment described herein provides a housing for a detection unit that is used to read a power meter unit mounted on a structure that is consuming power, the power meter unit including an indication with a cyclical property having a period that varies at a rate indicative of power consumption of the structure. The housing comprises a main body for housing internal electronics; an extension member releasably connected to the main body, the extension member having a head region for housing at least a portion of the sensor unit; an attachment means connected to the main body for mounting the main body on the power meter; means for extending the location of the head region with respect to the main body; means for pivoting the location of the head region with respect to the main body; and means for configuring the housing in a folded configuration for directing the sensor unit towards the periphery of the power meter when the indication is facing the periphery of the power meter.

BRIEF DESCRIPTION OF THE DRAWINGS

For a better understanding of the various embodiments described herein and to show more clearly how it may be carried into effect, reference will now be made, by way of example only, to the accompanying drawings in which:

FIG. 6b is a perspective view of the detection unit of FIG. 6a;

FIG. 6c is an exploded isometric view of the housing of a portion of the detection unit of FIG. 6a;

FIG. 8a is a perspective view of an exemplary alternative embodiment of a detection unit housing attached to a power meter in a projected configuration;

FIG. 8b is a front view of the detection unit of FIG. 8a;

FIG. 8c is a side view of the detection unit of FIG. 8a;

FIG. 10b is a front view of the detection unit of FIG. 10a;

FIG. 10c is a side view of the detection unit of FIG. 10a;

FIGS. 12a-12d are series of perspective views of the detection unit of FIG. 8a showing the steps of moving the position of the sensor unit from a projected configuration to the folded configuration; and, FIG. 13 is an exploded view of the detection unit housing of FIGS. 8a-8c.

DETAILED DESCRIPTION

Figure 1:
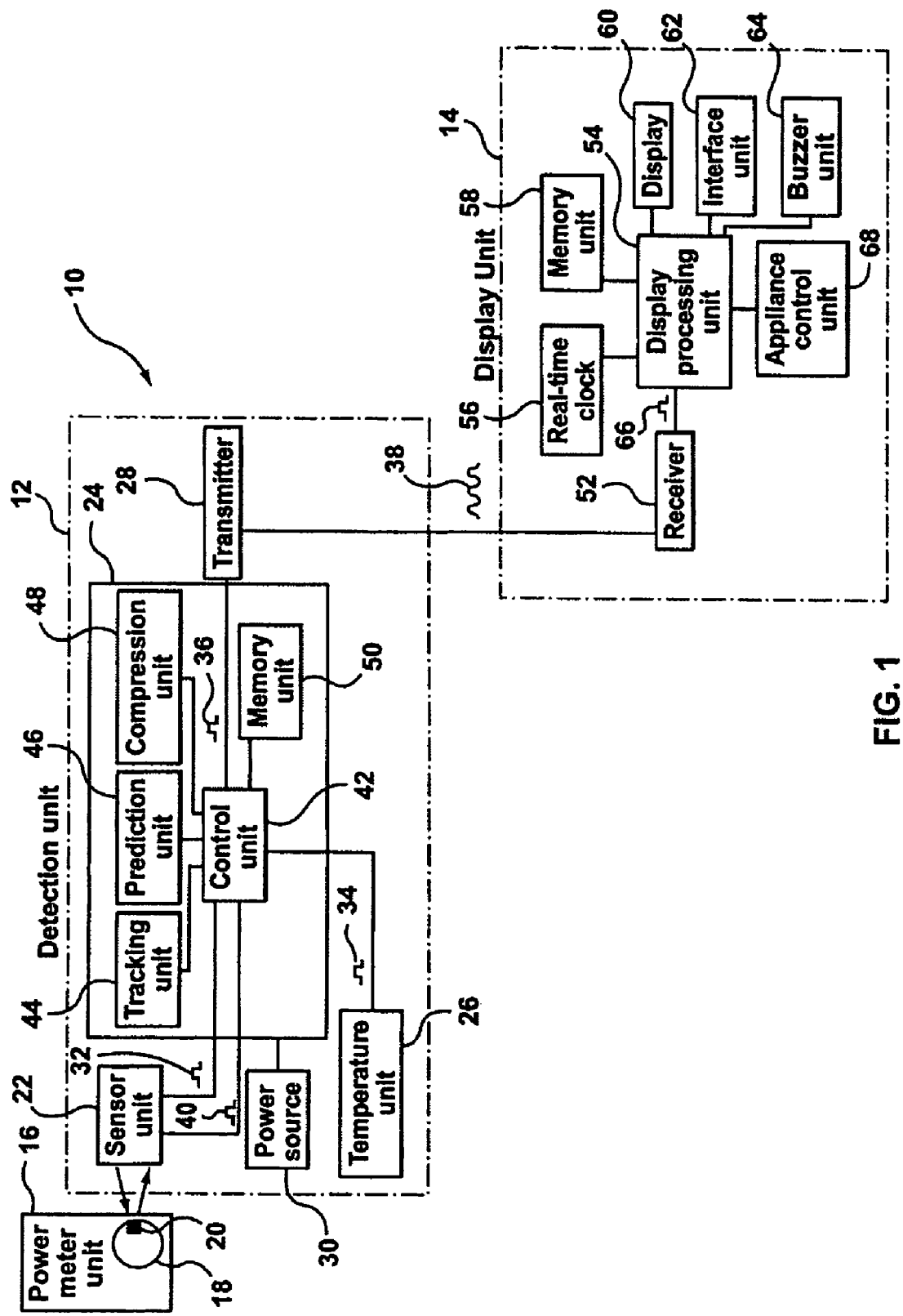
FIG. 1 is a block diagram of an exemplary embodiment of a power meter reader system.

In the following detailed description, numerous specific details are set forth in order to provide a thorough understanding of the various embodiments described herein. However, it will be understood by those of ordinary skill in the art that these embodiments may be practiced without these specific details. In other instances, well-known methods, procedures and components have not been described in detail so as not to obscure the description of these embodiments.

Further, it will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Referring first to FIG. 1, shown therein is a block diagram of an exemplary embodiment of a power meter reader system 10. The power meter reader system 10 comprises a detection unit 12 and a display unit 14. The detection unit 10 is mounted to a power meter unit 16 and the display unit 14 is mounted in a convenient location within the structure for which the power meter unit 16 is monitoring power consumption. The detection unit 12 and the display unit 14 are preferably wirelessly coupled. However, the detection unit 12 and the display unit 14 may be hardwired to each other in known manner. The physical structure of the detection unit 12 and the manner in which the detection unit 12 is mounted to the power meter unit 16 are discussed in further detail below.

As is commonly known to those skilled in the art, the power meter unit 16 is typically mounted on the outside wall of the structure for which the power meter unit 16 is monitoring electrical power usage (the meter unit 16 may also be on the inside of the structure). The power meter unit 16 has a clear plastic or glass cover for allowing the power usage to be read while protecting the power meter unit 16 from the elements such as rain or snow and against possible tampering. The power meter unit 16 also has a power meter unit 18, shown schematically for illustrative purposes, which rotates at a speed that indicates power usage. The power meter unit 18 is oriented approximately perpendicular to the cover of the power meter unit 16 and has a black mark 20 that is in the shape of a small circular arc along the top and edge of the power meter unit 18. The power meter unit 16 also has a plurality of dials (not shown) that indicate the current electrical power usage of the structure. The dials rotate in accordance with the rate of rotation of the power meter unit 18.

It should be understood by those skilled in the art that the power meter unit 16 may be a digital power meter unit with an alternative indication of power consumption such as a digital representation of the power meter disk 18, or a vertical or horizontal bar on an LED or LCD Display with a mark that moves across the display at the rate that the black mark on the power meter disk revolves. Other representations are also possible. The black mark 20 on the power meter unit 18 will hereafter be used in the description of the operation of the power meter system for ease of description. However, it should be understood that the black mark can generally be considered to be an indication having a cyclical property that has a period with a varying rate and that there are other types of power meters with other forms of indication as described above.

The detection unit 12 comprises a sensor unit 22, a processing unit 24, a temperature unit 26, a transmitter 28 and a power source 30. The sensor unit 22 detects the rotation of the power meter unit 18 and provides a consumption detection signal 32 to the processing unit 24 to indicate the rotation frequency of the power meter unit 18. The sensor unit is described in further detail below. The temperature unit 26 measures the outdoor temperature and provides a temperature signal 34 to the processing unit 24.

The temperature unit 26 is optional. However, it is preferable to include the temperature unit 26 for obtaining temperature information that can be used by the power meter reader system for augmenting the power consumption as is described in further detail below. The temperature unit 26 includes a temperature sensor, such as a thermistor, and a resistor used to bias the temperature sensor (both not shown). The value of the resistor is preferably chosen to draw the least amount of current possible while still allowing the temperature sensor to provide a reading of the outside temperature.

The temperature reading is a raw analog voltage level that is dependent on the outside temperature. The raw analog voltage level is sent by the transmitter 28 to the display unit 14 without any preprocessing. The display unit 14 then converts the raw analog voltage level to a temperature value. The display unit 14 performs the conversion to reduce the amount of processing that is done by the processing unit 24 and hence reducing the energy consumption of the detection unit 12.

The detection unit 12 includes one or more components for reducing power consumption as is described in further detail below. For instance, low voltage components are used to reduce power consumption. Further, the operating parameters of the detection unit are chosen to reduce power consumption. For instance, a low clock frequency, such as 32 kHz for example, is used for the processing unit 24. In addition, the operating voltage of the sensor unit 22, the processing unit 24, the temperature unit 26, and the transmitter 28 is reduced. Further certain components of the detection unit 12, such as the sensor unit 22, certain modules of the processing unit 24, and the RF circuitry of the transmitter 28 are placed into sleep mode when not in use. The sleep mode used for the sensor unit 22 is described in further detail below.

The processing unit 24 uses the consumption detection signal 32 and the temperature signal 34 as well as other information, as is described further below, for creating an information signal 36. The information signal 36 is sent to the transmitter 28 which generates and wirelessly transmits a transmission signal 38 to the display unit 14. The transmitter 28 modulates the information signal 36 for transmission at a suitable transmission frequency. The transmitter 28 is any suitable transmitter that has low current consumption and the ability to operate in a sleep mode. The transmitter 28 also preferably provides error correcting codes for encoding the information signal. Error correcting codes allows a certain amount of errors to be introduced during transmission, yet these errors can be corrected at the display unit 14. The benefit of such a transmission scheme is that the range for wireless transmission is increased for the same amount of power consumption. Alternatively, the power consumption can be reduced while still ensuring that the range for wireless transmission is sufficient. The transmitter 28 also provides data for a CRC check that can be used by the display unit 14 to throw out corrupt messages. This is beneficial since, as the power of the wireless transmission gets lower (i.e. the signal to noise ratio (SNR) gets lower), it is more likely that the wireless transmission can become corrupted. Since, reduced power consumption is a goal of the power meter reader system 10, transmission is preferably done at a low SNR. Consequently error correction codes and data for a CRC check is used to ensure that data is correctly received by the display unit 14.

The power source 30 provides power for the operation of the detection unit 12. The power source 30 is connected to the processing unit 24 which distributes the power to the remaining components of the detection unit 12. Preferably the power source 30 is a battery such as a 3.6V lithium AA battery for example.

The sensor unit 22 is physically positioned adjacent to the power meter unit 18 for detecting the rotation of the power meter unit 18. The sensor unit 22 comprises an IR emitting diode and at least one photo diode (described in more detail below). The IR emitting diode transmits a modulated light beam to the surface of the power meter unit 18. The modulated light beam is reflected by the power meter unit 18 at a certain level. However, when the modulated light beam encounters the black mark 20, the light beam is reflected at a lower level. Accordingly, the sensor unit 22 detects revolutions of the black mark 20 based on a lower amount of reflected light (this may also include the total absence of reflected light). The sensor unit 22 generates a pulse in the consumption detection signal 28 for each detection of the revolution of the black mark 20. The modulated light beam is modulated at a frequency of approximately 38 kHz so that sunlight can be filtered out by the sensor unit 22 (other suitable modulation frequencies may also be used). The use of modulation also reduces the power that is required by the sensor unit 22 since the modulation requires that the IR emitting diode is turned off for very brief periods of time. To further reduce energy consumption, the sensor unit 22 receives an enable control signal from the processing unit 24. Accordingly, the sensor unit 22 is only operational for a portion of the rotation of the power meter unit 18 which coincides with the passage of the black mark 20 past the sensor unit 22 (i.e. the sensor unit 22 is turned off until the black mark 20 is expected to return). This is described in more detail below.

The processing unit 24 controls the operation of the detection unit 12 such that the detection unit 12 operates in an energy efficient manner. In the exemplary embodiment of FIG. 1, the processing unit 24 includes a control unit 42, a tracking unit 44, a prediction unit 46, a compression unit 48 and a memory unit 50 (some of these components may be omitted in other embodiments as discussed further below). The control unit 42 directs the operation of the detection unit 12 to enable the activation of the sensor unit 22, to generate power meter disk rotation information, read outdoor temperature, generate packets of information to send to the display unit 14 and detect if the power source 30 is low. The processing unit 24 is implemented by any suitable, ultra-low power microcontroller with associated hardware and software.

The tracking unit 44 tracks the movement of the power meter unit 18 based on the current speed and the maximum acceleration of the power meter unit 18. The tracking unit 44 uses this information to dynamically set a sleep period for the sensor unit 22. The sleep period is provided to the control unit 42 each time the sleep period is updated. During the sleep period, the control unit 42 disables the operation of the sensor unit 22 via the enable control line 40 and enables the sensor unit 22 otherwise. The sleep period can be based on an estimate of the return time of the black mark 20 for the next revolution of the power meter unit 18. The return time of the power meter unit 18 can be estimated based on the last two detections of the black mark 20. Alternatively, the last detected revolution of the power meter unit 18 can be used to estimate the revolution rate of the power meter unit 18. For example, if the tracking unit 44 estimates that the last return time of the meter unit 18 took 2 seconds, then it is highly likely that the next cycle will be somewhere close to that same time period.

The kinematics of the power meter unit 18 can also be used to determine the minimum time required for the power meter unit 18 to make the next full revolution. The sleep period can then be chosen accordingly. Based on kinematics, the fastest revolution time for the power meter disk is given by equation 1:

$$t_f = t_c/(1 + \text{MAX\_DELTA} * t_c/25920000) \quad (1)$$

where $t_f$ is the fastest revolution time for the power meter unit 18, $t_c$ is the last time it took for one full revolution, MAX_DELTA is the value of watts "kicking" in during the next cycle (i.e. revolution of the power meter unit 18) and the value 25920000 is a constant. The constant is calculated by multiplying the kH factor of the power meter 16 (which is typically 7.2 Whr) with the amount of seconds in 1 hour and the constant 1000. The value of $t_c$ can be based on the average or instantaneous revolution speed of the power meter unit 18. There can be an array of values that can be used for MAX_DELTA. Some exemplary numbers for MAX_DELTA include 2000, 5000 or 10000. The particular value of MAX_DELTA that is used depends on the current revolution speed of the power meter unit 18. If the unit 18 is revolving at a slow speed, then a larger value of MAX_DELTA, such as 5000, can be selected because there are many devices that can be turned on to increase power consumption within the structure. However, if the unit 18 is revolving at a high speed, then a lower value of MAX_DELTA, such as 2000, can be selected. This allows for the selection of a longer sleep period without missing the next revolution of the black mark 20. This is effective at high power consumption levels associated with the structure (i.e. at fast revolution speeds for the power meter unit 18) since there aren't many more devices that can be turned on, or turned on at a higher level, in the structure to consume more energy and make the unit 18 revolve at a faster rate. However, at lower revolution rates, the sleep period cannot be set as long using this method.

In an alternative, the tracking unit 44 can set the sleep period according to a percentage of the last full revolution time of the power meter unit 18. For example, if the power meter unit 18 took 3 seconds for the last revolution and a 50% sleep period is set by the tracking unit 44, then the sensor unit 22 will sleep for 1.5 seconds after the last detection the black mark 20 and then "wake-up" to detect the next occurrence of the black mark 20. This form of tracking is somewhat adaptive in nature. For example, if the rotation of the power meter unit 18 slows down to 5 seconds per revolution, the control unit 22 will change the sleep period to 2.5 seconds. However, if the rotation of the power meter unit 18 speeds up, there is a potential for cycles to be missed. However, once the sensor unit 22 is turned back on it will adjust to the speed of the meter unit 18.

The percentage used to determine the sleep period can also be changed depending on the speed of the power meter unit 18. For instance, if the power meter unit 18 is rotating at a high speed, then the sleep period percentage can be set to a higher value such as 90%, for example. Alternatively, if the power meter unit 18 is rotating at a slower speed, then the sleep period percentage can be set to a lower value such as 50%, for example. Accordingly, when the power meter unit 18 transitions from a low revolution speed to a high revolution speed, a progressively higher sleep period percentage can be used. The rationale behind this is that at high rotation rates, the power meter unit 18 is unlikely to travel any faster since most of the devices in the structure that consume energy are already turned on which causes the power meter unit 18 to rotate at such a high rate. In this case, it is extremely unlikely that the power meter unit 18 will rotate any faster. Accordingly, setting a high sleep period in this case will most likely not result in any missed detections of the black mark 20. Alternatively, when the power meter unit 18 is rotating at a slow rate, it is quite likely that the power meter unit 18 can speed up quite quickly. Firstly, the inertia of the power meter unit 18 is low so that the power meter unit 18 can change speeds quickly. Secondly, and more importantly, since the power meter unit 18 is rotating at a slow speed, there are many devices that can be turned on, or alternatively turned on at a higher setting, which increases power consumption and therefore the speed of the power meter unit 18. This is even more pronounced depending on the time of day, when it is more likely that devices are turned on and off. Therefore, at low speeds, to avoid missing detections of the black mark 20, the sleep period is typically set to a lower percentage of the cycle time of the power meter unit 18.

Furthermore, in either a periodic or aperiodic fashion, the sensor unit 22 does not enter sleep mode during a complete rotation of the power meter unit 18, so that the sensor unit 22 can avoid becoming out of sync with the rotation of the power meter unit 18. For example, if a rotation of the power meter unit 18 is missed, the sensor unit 22 will not be aware of this and will assume that the revolution time of the power meter unit 18 is longer than it actually is and will add the extra time to the current revolution cycle. This may cause the sensor unit 22 to miss successive cycles. To avoid this, full cycle detection can be used at various times during the operation of the detection unit 12.

In another alternative, the tracking unit 44 can adjust the sleep period based on the time of day since the amount of power consumption, and hence the rotation speed of the power meter unit 18, can vary depending on the time of day. For instance, power consumption may decrease at night, and it also very unlikely that additional devices will turn on at night, so the sleep period can be set to a larger percentage of the rotation speed of the power meter unit 18 at night. In another alternative, the sleep period can be based on the last X (e.g. 100) revolution times for the power meter unit 18.

In another alternative, the tracking unit 44 can adjust the sleep period based on the amount of energy remaining in the power source 30. For instance, if the power source 30 is a battery and the control unit 42 detects a low amount of power remaining in the battery, then the sleep period can be extended to conserve power consumption by the detection unit 12 at the cost of reduced accuracy of counting the number of rotations of the power meter unit 18.

In each of the above cases, the tracking unit 44 also sets upper and lower limits for the sleep period. An upper sleep period limit is set so that the sensor unit 22 will not miss the detection of too many cycles should the rotation of the power meter unit 18 go from a very slow speed to a very high speed before the sensor unit 22 wakes up. The upper sleep period limit is set to be approximately half the minimum time the black mark 20 is in view of the sensor unit 22. This is based on the Nyquist rate for sampling the black mark 20 on the power meter unit 18 and ensures that the sensor unit 22 will be on often enough to detect the black mark 20 even for the fastest speed at which the power meter unit 18 can rotate. This limit is capped at approximately 90-95% of the revolution time for the power meter unit 18. Conversely, the lower sleep period percentage, which is used at low revolution speeds of the power meter unit 18, is set based on the fact that it is known that the power meter unit 18 can go much faster as there are more loads that are available to consume power and hence increase the rotational speed of the power meter unit 18. This limit is capped at approximately 50%.

The prediction unit 44 is used to alter the rate at which the transmitter sends the transmission signal 38 to the display unit 14. Accordingly, the data sent to the display unit 14 is not necessarily sent at a periodic rate. Rather, the prediction unit 44 uses prediction techniques to generate parameters for a prediction model that predicts the revolution of the power meter unit 18. The values of the model parameters are sent to the display unit 14 and the display unit 14 uses the values of the prediction model parameters to "simulate" the rotation of the power meter unit 18 and calculate future values of power usage in real-time. In particular, depending on the accuracy of the prediction model, the values of power usage are updated by the display unit 14 at the same rate that the power meter unit 18 is actually rotating. The usage of prediction model parameters advantageously allows the display unit 14 to show the current power consumption without the detection unit 12 using up the power source 30 by sending frequent transmissions to the display unit 14. Accordingly, the detection unit 12 reduces energy consumption since transmission occurs less often. However, it appears as if the display unit 14 is receiving a steady stream of data, since the display unit 14 is providing power consumption data of the structure in real-time, even though the data transmissions from the detection unit 12 are not periodic. Also, it should be understood that when each data transmission is received, the display unit becomes synchronized with the real number of cycles that have occurred since this information is provided by the detection unit 12. Another advantage of using a prediction model, is that the values of the prediction model parameters are transmitted rather than the actual data; this reduces the amount of data that is transmitted to the display unit 14 which also reduces the power consumption of the detection unit 12.

The values for the model parameters that are sent to the display unit 14 are updated when the model becomes out of sync with the readings taken by the sensor unit 22. For instance, when the prediction unit 46 determines that the prediction model has a prediction error $\epsilon_{pred}$ that is greater than a predetermined prediction error threshold, such as 1 kWh for example, the prediction unit 46 recalculates values for the prediction model parameters, based on the latest values of the consumption detection signal 32. The updated values of the prediction model parameters are then sent to the display unit 14. The prediction unit 46 can also set a minimum and maximum time period between transmissions so that the detection unit 12 does not send too many transmissions to the display unit 14 while at the same time communicating at a basic rate to let the display unit 14 know that the detection unit 12 is still operational. Exemplary minimum and maximum time limits for sending transmissions are 3 minutes and 20 minutes respectively. The effect of the minimal time period for transmissions can also be implemented by setting the prediction error low enough so that the prediction error may be violated in a short period of time.

The complexity and accuracy of the prediction model is based on the computing power of the processing unit 24, the type of prediction algorithm being used, the amount of data from the consumption detection signal 32 that is used for prediction, and the determinism of the data in the consumption detection signal 32. The complexity and accuracy of the prediction model is also governed by the amount of power that must be expended by the detection unit 12 while employing the prediction model; it is desirable for the power consumption of the detection unit 12 to be as low as possible. An example of a prediction model that can be used by the prediction unit 46 is given by equation 2:

$$\tilde{s}[n]=s[n-n_{lag}]+n_{lag}\cdot v \quad (2)$$

where $\tilde{s}$ is the predicted power consumption in the structure, s is the actual power consumption in the structure, v is the velocity of the power meter disk 18 (based on the last k values of s), n is the current data index and $n_{lag}$ is the number of index points into the prediction. The velocity (i.e. rotational speed) is inversely proportional to the last revolution time of the power meter unit 18 and therefore proportional to the power consumption of the structure. In this sense, the velocity is the average velocity of the power meter unit 18. The velocity could also be based on the instantaneous velocity of the power meter unit 18 according to the equation 1 which is based on kinematics. The index n is in terms of discrete time. For example, for each interval of n, 3 seconds may have expired. For instance, n=1 means 3 seconds have passed. The value $s[n-nl_{ag}]$ represents the last known power consumption value before the current version of prediction began. Accordingly, the prediction parameters that are transmitted for this prediction model are the absolute cycle count and the time for the last revolution.

The prediction model also employs a prediction error that is used to recalculate values for the parameters of the prediction model when the prediction error of the prediction model exceeds a certain level, such as, for example, $\epsilon_{pred}$=200 cycles or equivalently 10 cents based on a kh factor of 7.2 Whr and an energy rate of 7 cents per kWh. Other suitable examples of prediction model errors include $\epsilon_{pred}$=20 cycles (i.e. 1 cent) or 100 cycles (i.e. 5 cents).

The prediction model shown in equation 2 is referred to as a LAST prediction model since it is based on the velocity of the power meter unit 18 in the latest revolution. Another example for a prediction model that can be used is referred to as a LINEAR prediction model. Although the LAST prediction model is linear in that it uses the latest speed of the power meter unit 18 as the velocity, the LINEAR prediction model uses the difference in cycle count between successive transmissions of data and the elapsed time between the transmissions from the transmitter to calculate the velocity. The remainder of the LINEAR prediction model operates in the same fashion as the LAST prediction model.

Other classes of prediction models may also be used such as AR, MA, or ARMA models. Kalman filtering or other forms of tracking may also be used. Simple, nonlinear prediction models may also be used. However, it is preferable to use a prediction model that has low computational complexity for reducing the power consumption of the detection unit 12. This means that the order of the prediction model is high enough to give accurate results but low enough to avoid undue amounts of computational complexity.

The control unit 42 generates information for transmission. In one embodiment, the generated information includes:
a) the time in milliseconds that it took for the last revolution of the power meter unit 18;
b) the cycle count (i.e. the number of revolutions of the power meter unit 18 that have been counted by the detection unit 12);
c) the voltage status of the power source 30;
d) the outside temperature;
e) a device address (the transmitter 28 has a unique address); and,
f) cyclic redundancy check (CRC) data.

The model parameters that are sent from the detection unit 12 to the display unit 14 depend on the particular prediction model that is being used. One option is to base the prediction models on the cycle count, and the latest revolution time of the power meter unit 18 according to equation 2. The values for these parameters are given in elements a and b above. In this particular example, the display unit 14 can synchronize the displayed cycle count with the cycle count that is transmitted by the detection unit 12. The display unit 14 can then use the cycle count and the latest revolution time to predict future cycle counts until the next transmission is received. If on the next transmission, the display unit 14 has "over-predicted" and is displaying a higher consumption rate than the real corresponding cycle count, then one option is to not update the display unit 14 until the real energy consumption value "catches-up" to the predicted value. This is to prevent the display unit 14 from showing a lower consumption value after it had previously displayed a higher consumption value. If however the power meter unit 18 speeds up, then on the next data transmission, the display unit 14 will display a sudden "jump" in energy consumption.

The compression unit 48 receives the generated information and compresses this information to provide the information signal 36 which is then transmitted by the transmitter 28. The compression reduces the length of the generated information. As a result, the transmitter 28 does not expend as much energy in transmitting the information signal 36. This is beneficial since wireless communication can be a key cause of energy dissipation. However, there must be an acceptable balance between a reduction in the amount of data that is transmitted for reducing energy consumption and an acceptable level of information loss that is introduced by compression.

Alternatively, the compression unit 48 can be used to compress the raw data in the consumption detection signal 32 or a series of values for the prediction model parameters that have been calculated over a given time period. This is beneficial in the case where data transmissions from the detection unit 12 to the display unit 14 are not that frequent. This situation can arise when a consumer does not want real-time feedback but wants to review the energy consumption once a day or possibly once a week. In this case, the information provides resolution between successive data transmissions; i.e. the consumer can get an idea of the average energy consumption between successive data transmissions, however, by transmitting more information, the consumer can get an idea of what happened in energy consumption between the two transmission times and may see transient increases or decreases in energy consumption of the structure.

The compression unit 48 uses a compression method that is easy to compute using a standard low powered microcontroller. Any compression method that exceeds the memory capacity of the memory unit 50, the time between scheduled updates to the display unit 14, or the power to transmit the data is not effective. It should also be noted that if too much data is compressed and the message sent containing the information is lost or corrupted then there is no way to recover the data without resending the data. However, limitations of the memory unit 50 may prevent the resending of data. Further, the estimation of the power consumption due to the compression method is based on the number of bits needed to represent the compressed time series. The fewer the number of bits needed to represent the compressed time series, the less power required to transmit the same amount of information.

Several compression methods can be used to compress a time series such as, but not limited to, Wavelets, Fourier Transforms, Piecewise Linear Approximations and polynomials. In addition, once a compression method is selected, an acceptable compression error $\epsilon_{comp}$ is preferably specified. The compression error $\epsilon_{comp}$ represents the amount of information that can be reasonably lost due to compression. This allows the algorithm to compress the data such that when it is uncompressed the values are within $\epsilon_{comp}$ of the original data values. Once set, the prediction error $\epsilon_{comp}$ may be dynamically changed. However, it is preferable that the dynamic value of the prediction error never exceed the originally set $\epsilon_{comp}$ because this value specifies the maximum allowable error. In general, the greater the $\epsilon_{comp}$ the higher the compression rate that can be achieved and thus a greater reduction in power consumption.

In this case, the data to be compressed is power consumption data which is a time series x[n] that has a plurality of data elements in which the index n is a time index and the values associated with a time index is the current demand. if the data series is graphed, the area under is the graph is the power consumption. The demand can be calculated by multiplying the kH factor of the power meter unit 16 with the constant 3600 and dividing by the latest revolution time of the power meter unit 18 that is associated with the current time index. The success of a compression technique depends on the presence of an underlying deterministic process in the time series x[n]. An example of a compression algorithm is the following. The compression error $\epsilon_{comp}$ defines a maximum error in the compression algorithm. The algorithm begins with taking the first two raw data points without compression. These two data points are successive absolute cycle counts and the times at which they occur. From this a revolution time can be calculated (alternatively the kinematic equation can be used for the revolution time) and the demand is calculated as explained above. The demand and the time index is added to the compressed data series. The next demand point is repeatedly calculated and only added to the compressed data series if the absolute value of the magnitude of the demand point minus the magnitude of the previous demand point in the compressed data series is larger than the prediction error $\epsilon_{comp}$. If the absolute value of the difference is larger than the magnitude of the demand point and the corresponding time index is added to the compressed data series. This procedure continues until there are no more data points to compress. It should be understood that rather than save the demand value, the corresponding revolution time can be saved instead since these values are related to one another by a factor. In another alternative, the absolute cycle count at the time index may also be saved in the compressed data series. Also, rather than saving the value of the demand or revolution time, the delta (i.e. difference between the current demand or revolution time and the previous value) can be saved. The compression ratio (CR) that can be achieved is represented by equation 3:

$$CR = \frac{K(b_s + b_{tp})}{nb_s} \quad (3)$$

where K is the compressed sequence length; $b_s$ is the size of the sample in terms of bits; $b_{tp}$ is the size of the time index in terms of bits and n is the number of samples in the original time series prior to compression which represents the number of times that the rate of rotation of the power meter unit 18 is checked. The memory unit 50 is memory that is associated with the processing unit 12. The memory unit 50 is preferably an EEPROM. However, depending on the implementation of the processing unit 24, the memory unit 50 may be RAM or another suitable memory device that has low power consumption. The memory unit 50 is used to save important parameters that are needed for the operation of the detection unit 12 and that can not be lost should power to the detection unit 12 be removed. For instance, the memory unit 50 can save instructional code that the control unit 42 uses to control the operation of the detection unit 12. The memory unit 50 is also preferably used to save the absolute cycle count.

The tracking unit 44, prediction unit 46 and compression unit 48 operate independently of each other. Accordingly, alternative embodiments of the detection unit 12 can incorporate one or more of these units and it is not necessary that the detection unit 12 contain each of these units. However, the greatest amount of reduction in energy consumption for the detection unit 12 is achieved when the detection unit 12 contains all of these units. However, if both compression and prediction are used, if the compression error $\epsilon_{comp}$ is equal to the prediction error $\epsilon_{pred}$, then there is no benefit to compression because the values of the prediction model parameters will be updated often enough to allow the display unit 14 to construct the same representation of the data that compression would have constructed. It is therefore necessary to set the prediction error $\epsilon_{pred}$ higher than the compression error $\epsilon_{comp}$. Effectively, this means that data for a certain amount of time (Tc) is compressed and that the data is transmitted every (Tp) seconds due to the amount of prediction error that is tolerated and that Tp is greater than Tc (i.e. having a larger prediction error allows one to use the same values for the prediction model parameters for a longer period of time, since over time the prediction error will accumulate).

The display unit 14 comprises a receiver 52, a display processing unit 54, a real-time clock 56, a receiver memory unit 58, a display 60, an interface unit 62, a buzzer unit 64 and an appliance control unit 68. Some of these elements may be optional such as the buzzer unit 64, the appliance control unit 68 and the real-time clock 56 if another means can be obtained to provide time. The display unit 14 may be plugged into a wall receptacle to receive power from the mains supply or the display unit 14 may have an internal power source such as a battery (not shown) that is connected in known manner.

The receiver 52 receives the transmission signal 38, performs the necessary demodulation and pre-processing, as is commonly known to those skilled in the art, and generates a received signal 66 that is similar to the information signal 36. Data will typically be sent in data packets in the transmission signal 38. During the generation of the received signal 66, the receiver 52 checks the device address data in the received data packets to ensure that the transmission signal 38 was received from the appropriate transmitter 28 and not from a transmitter of a different power meter reader system. If the receiver 52 determines that the transmission signal 38 was provided by the transmitter 28 of a different power meter reader system, then the receiver 52 will discard the received data packets. The receiver 52 also checks the CRC data in the data packets of the transmission signal 38 to make sure that data integrity is maintained during transmission. If a discrepancy is found in the CRC data, there is an error in the data packets of the transmission signal 38 and the receiver 52 discards these data packets. Further, continuously "listening" for the transmission signal 38 is power consuming. Accordingly, the transmitter 28 and the receiver 50 preferably employ unidirectional communication from the transmitter 28 to the receiver 52.

The receiver 52 provides the received signal 66 to the display processing unit 54 for further processing. The display processing unit 54 extracts the time for the last revolution of the disk and the cycle count, and uses the same prediction model that was used by the prediction unit 46 (if prediction is employed) to display the instantaneous demand in Wh or kWh or $/hr (rather than dollars another appropriate form of currency can be used depending on the country in which the power meter reader system is being used). The display processing unit 54 also uses this information to display a disk on the display 60 that spins at the same rate as the power meter unit 18. The display processing unit 54 also extracts the power source voltage status information and the temperature reading to display this information on the display 60. If the power source voltage is low, then the display processing unit 54 will display a battery low symbol on the display 60.

The display processing unit 54 uses the prediction model parameters to predict the amount of energy consumption that occurs until the next data transmission from the detection unit 12. In one example, the detection unit 12 sends over the absolute cycle count (which is never reset in the detection unit 12) and the last revolution time. The receiver uses these two values to predict the occurrence of successive revolutions of the power meter unit 18.

The display processing unit 54 can also allow the consumer to predict energy consumption for a specified time into the future, and also has the ability to store a history of energy consumption in the memory unit 56. Accordingly, the display processing unit 54 employs prediction on a longer time scale to allow the consumer to predict energy consumption for the next billing cycle (i.e. 30 days) for example (a similar prediction model can be used as those previously described except with a longer time period). The long term prediction (i.e. long-range bill prediction) can use linear regression based on the energy consumption in the last several days (i.e. the energy consumption is saved daily by the display unit 14) to predict the amount of the future energy bill.

The display processing unit 54 can also use the revolution count information to display the amount of greenhouse gas that the structure, which consumes the power, is responsible for emitting. This calculation is based on the region in which the structure is located since it is based on carbon-dioxide emission rates which are specific for a particular region or utility company. In particular, the display processing unit 54 can show the amount of carbon-dioxide that has been emitted in terms of tones, pounds or kilograms. Alternatively, the display processing unit 54 can display environmental credits/token/units that have been accumulated, used or that are remaining. These tokens may be distributed by the government or an environmental agency. The display processing unit 54 may also display a warning signal to notify the user of excess consumption; this may include but is not limited to a graphic on the display 60 such as a smoke stack, a sad face and/or a beep provided by the buzzer unit 64. The carbon-dioxide emission rates based on the province, state and/or country in which the power meter reader system 10 is used can be pre-programmed into the display processing unit 54. The consumer can then simply select their location on the display unit 14.

The real-time clock 56 is used to maintain time in the display unit 14. The time is received by the display processing unit 54 for computing the current time and displayed on the display 60. The time is also used by the display processing unit 54 in conjunction with Time of Use Energy Rates. For instance, depending on the particular utility.company, the consumer may be charged different rates for energy consumption depending on the time of day when the energy is consumed. This is done to reduce energy consumption at peak times. For example, between 5 PM and 8 PM. a utility company may charge 10 cents/kWh rather than 6 cents/kWh so that the consumer reduces energy consumption between 5 and 8 PM.

The memory unit 58 can be any suitable memory device such as an EEPROM. The memory unit 58 is used to store critical information so that the display unit 14 can be powered down and powered back up without losing important information. Examples of critical information include different rates for energy consumption based on location, the cumulative energy consumed, the number of days to use for long-range bill prediction, etc.

The display unit 60 can be any suitable display device such as an LCD. The display unit 60 is used to display time and date information, power consumption in dollar amounts (or other currency), or other consumption units such as kWh, carbon-dioxide emission levels, and a disk that spins at the same rate as the power meter unit 18 as well as other information. The display unit 60 is described further below in an exemplary embodiment.

The interface unit 62 can be a keypad or similar device which allows the user to enter information into the display unit 14 or to choose between various modes of operation. The buzzer unit 64 provides an audible sound to provide various information to the consumer. For instance, the buzzer unit 64 may sound an alarm when the voltage level of the power source 30 of the detection unit 12 is running low. The buzzer unit 64 can also provide a sound to verify that the consumer has depressed a key on the interface unit 62. Any suitable buzzer can be used.

The appliance control unit 68 can be used in conjunction with the information that is provided by the detection unit 12 to direct the operation of appliances within the structure for which energy consumption is being monitored. The appliance control unit 68 is connected to the structure's powerline to send appliance control signals to the appliances via a powerline communications device. Any suitable powerline communications device can be used such as the X10™ or CEBUS™ powerline devices. The appliances have a corresponding receiver module with a unique address. Accordingly, the appliance control unit 68 can send specific control instructions to a particular appliance. These control instructions can direct the appliance to turn on, turn off, to increase an operational setting or decrease an operational setting. For example, the appliance can be an air conditioner and a control instruction may be to decrease the amount of cold air provided by the air conditioner.

In use, the appliance control unit 68 receives at least one of temperature information, energy consumption information and time information from the display processing unit 54 and uses this information to control an appliance. For instance, based on temperature information, and depending on the season and the particular temperature, the appliance control unit 68 can instruct a heating or cooling appliance to increase or decrease its operational setting. Alternatively, based on energy consumption, the appliance control unit 68 may instruct several appliances to turn off to conserve energy if the current level of energy consumption is too high. In another alternative, based on the time of day, the appliance control unit 68 can instruct one or more appliances to turn off. For instance, some utilities charge a higher rate during peak periods to encourage consumers to consume less energy. During these times periods, the appliance control unit 68 can instruct some of the more power hungry appliances to turn off. Of course, these instructions are within reason; i.e. it is not reasonable to turn off a fridge since the contents within the fridge may spoil. Rather than having the appliances turn off, the appliance control unit 68 can alter the operation level of the appliances.

Figure 2:
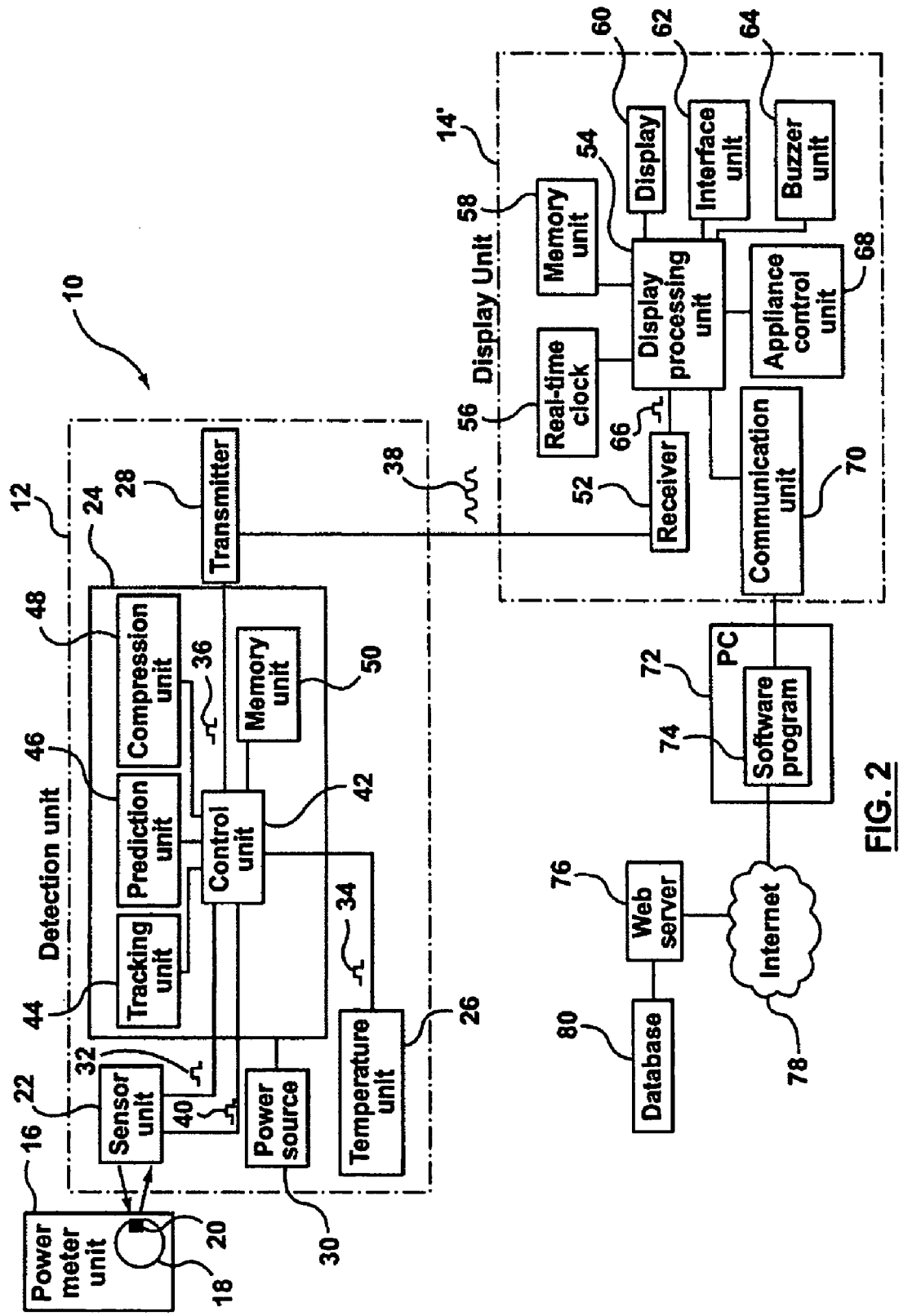
FIG. 2 is a block diagram of another exemplary embodiment of a power meter reader system.

Referring now to FIG. 2, shown therein is a block diagram of another exemplary embodiment of a power meter reader system 10' with an alternative display unit 14'. In this case, the display unit 14' includes a communication unit 70 for communicating with a computing device such as a PC 72. The communication unit 70 can be an RS232 data interface, a USB port or any other suitable communication device. The PC 72 can be connected to the display unit 14' and runs a utility software program 74 to interact with the receiver 52. The software on the PC 72 can be used to upload the history of energy consumption from the display unit 14' so that the consumer can make graphs, etc. to determine when the most energy is being consumed. It should be understood by those skilled in the art that another appropriate computing device can be used rather than a PC.

The consumer can also use the PC 72 to connect with a website provided by a utility web server 76 over the internet 78. The consumer may browse the web site to view utility rates, view consumption patterns and get energy saving hints and green house gas information. The utility web server 76 would obtain this information from an associated utility database 80. The consumer can also download carbon-dioxide information from the website and provide this information to the utility software program 74 which then passes this information to the display unit 14'.

Figure 3:
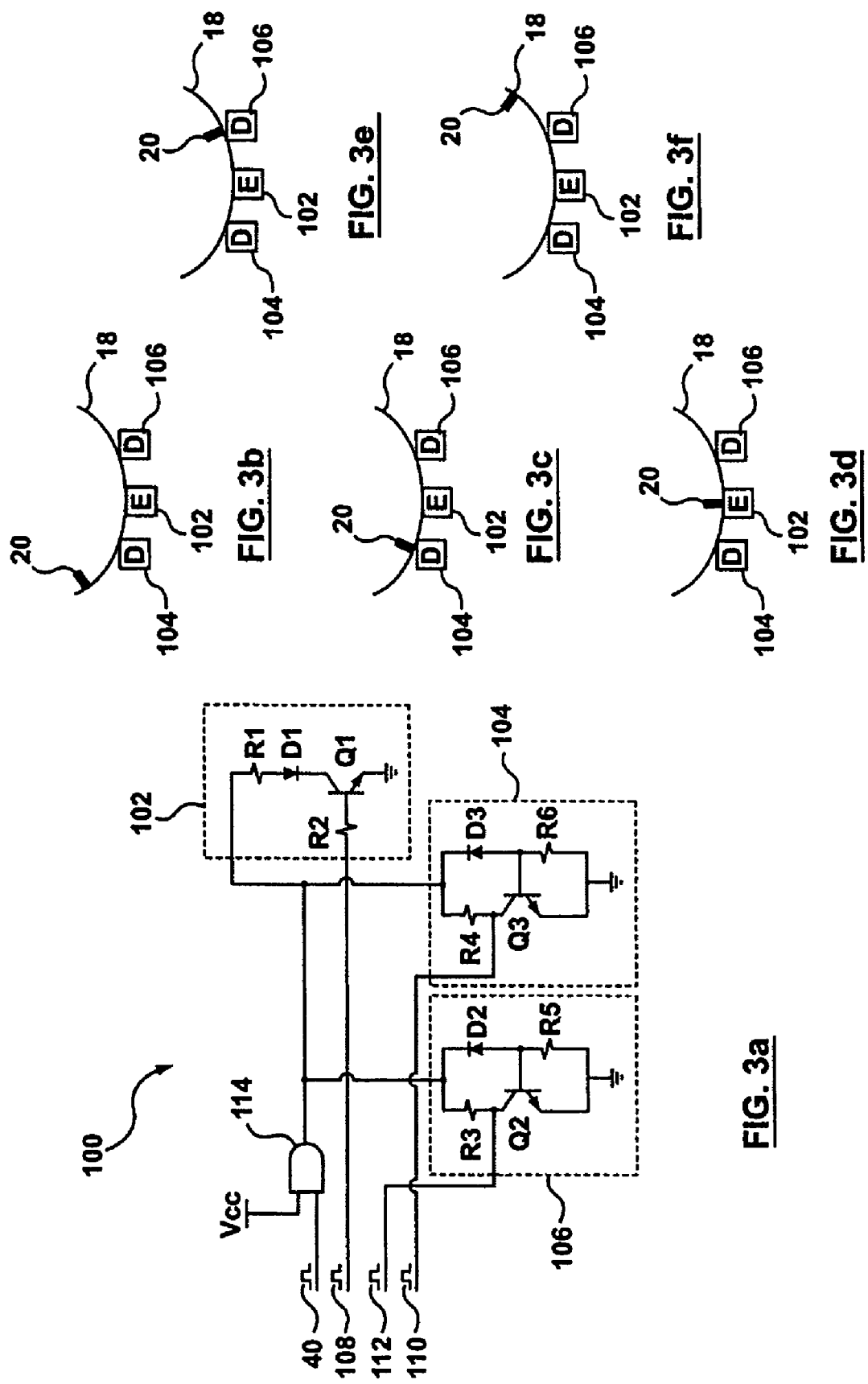
FIG. 3a is a schematic of an exemplary embodiment of a sensor unit that can be used in the power meter reader systems of FIGS. 1 and 2.
FIGS. 3b-3f are a series of illustrations of the operation of the sensor unit of FIG. 3a with respect to the motion of the black mark on the power meter disk.

Referring now to FIG. 3a, shown therein is an exemplary embodiment of a sensor unit 100 that can be used with both of the power meter reader systems 10 and 10'. The sensor unit 100 comprises an emitter 102, a first detector 104 and a second detector 106. In this embodiment, two detectors are used to make the sensor unit 100 more robust to false detections as well as ambient light. Furthermore, in this embodiment, the sensor unit 100 receives a polling signal 108 from the control unit 42 as well as the enable control signal 40. The sensor unit 100 also provides first and second detection signals 110 and 112 that are combined to form the consumption detection signal 32. In terms of physical layout, the emitter 102 is located between the first detector 104 and the second detector 106 (this is illustrated in FIGS. 3b-3f and discussed in more detail below).

The enable control signal 40 is combined with the VCC power supply signal in a logical AND operation by the AND gate 114. Accordingly, when the enable control signal 40 is high, the VCC power supply signal is provided to the remainder of the circuitry of the sensor unit 100 thereby enabling the sensor unit 100. Otherwise, the sensor unit 100 is in sleep mode with no power consumption. Alternatively, rather than having the AND gate 114, other suitable devices may be used such as a CMOS transistor or a more complex transmission gate. It should be understood that capacitors to ground can be connected in parallel with VCC to remove noise.

In an alternative, the AND gate 114 can be replaced by a transmission gate; i.e. a CMOS transistor for example, can be used. Alternatively, the VCC power supply signal can be provided by a pin on a microcontroller if a microcontroller is used to implement the control unit 42 and a sufficient amount of current can be provided by the pin.

In this exemplary embodiment, the emitter 102 comprises a light emitting diode (LED) D1 connected in series with a resistor R1 and a transistor Q1. The resistor R1 is connected to the output of the AND gates 114 and to a first node of the LED D1. The other node of the LED D1 is connected to the collector of the transistor Q1 and the emitter of the transistor Q1 is connected to ground. The base of the transistor Q1 is connected to a first node of a resistor R2. The other node of the resistor R2 is connected to the polling signal 108. In use, when the sensor unit 100 is enabled and the polling signal 108 is pulsed high, the transistor Q1 is turned on and conducts current which allows the LED D1 to emit light. The LED D1 is selected such that it emits infrared light. The LED D1 may emit modulated IR light at a frequency of 38 kHz for example although other modulation frequencies may be used such as 2 kHz for example. The detection signals 110 and 112 are then filtered by a bandpass filter that has a passband that matches the modulation frequency used to emit the IR light. The bandpass filtering can be done in hardware (not shown) or via software by a unit within the processing unit 24.

The first detector 104 and the second detector 106 are preferably implemented to have the same structure so that the first and second detection signals 110 and 112 are similar to one another. Accordingly, only the first detector 104 will be described. The first detector 104 comprises a photodiode D3 connected in series with a resistor R6. A first node of the photodiode D3 is connected to the output of the AND gate 114 and a second node of the photodiode D3 is connected to the resistor R6. The other node of the resistor is connected to ground. The series combination of the photodiode D3 and the resistor R6 is connected in parallel with a series combination of a resistor R4 and a transistor Q3. A first node of the resistor R4 is connected to the output of the AND gate 114 and a second node of the resistor R3 is connected to the collector of the transistor Q3. The base of the transistor Q3 is connected to the second node of the photodiode D3. The emitter of the transistor Q3 is connected to ground.

In use, when the sensor unit 100 is enabled and the polling signal 108 is pulsed high, the LED D1 emits IR light that is reflected by the shiny surface of the power meter unit 18. In this case, the black mark 20 has not come into the vicinity of the LED D1 or the photodiode D3. Accordingly, the photodiode D3 is conducting, the transistor Q3 is turned on and current flows through resistor R4. Accordingly, there is a voltage drop across the resistor R4 and the voltage at the emitter of the transistor Q3 is relatively constant and has a low magnitude with respect to the power supply voltage VCC. However, when the LED D1 shines IR light on the black mark 20, not as much energy is reflected by the power meter unit 18. Consequently, the photodiode D3 turns off, no current flows through the resistor R6 and the transistor Q3 turns off. Accordingly, only a small amount of current flows through the resistor R4 and a high voltage with respect to the power supply voltage VCC is seen at the emitter of the transistor Q3 and hence in the first detection signal 110.

Referring now to FIGS. 3b-3f, shown therein is an illustration of the operation of the sensor unit 100. The LED D1 and the photodiodes D2 and D3 are oriented with the photodiodes D2 and D3 on either side of the LED D1. These elements are spaced according to the angular extent of the black mark 20 which is typically 5 degrees or so. In one exemplary embodiment, these elements are separated by approximately 3 or 4 mm. This spacing is also chosen to ensure that reflections from small black specks on the power meter unit 18 will not trigger both photodiodes. In addition, these elements have a plastic shield between them so that light from the LED D1 does not go directly to either photodiode D2 or D3. Further, the voltage from each photodiode D2 and D3 can be subtracted from one another to cancel out any common mode voltage caused by IR going directly to the photodiodes.

FIG. 3b includes a series of panels that depict the different cases for the location of the black mark 20 on the power meter unit 18 with respect to the location of the emitter 102 and the first and second detectors 104 and 106. These five cases are represented by a state machine with five corresponding states. The state machine is implemented in the control unit 42. FIG. 3b shows the case where the black mark 20 has yet to reach the emitter 102 and the first and second detectors 104 and 106. In this case, the output of the first and second detectors is a low logic level (i.e. 0). FIG. 3c shows the case where the black mark 20 is close to the emitter 102 and the first detector 104 but not the second detector 106. Consequently, the output of the first detector 104 is a high logic level (i.e. 1) and the output of the second detector 106 is a low logic level. FIG. 3d shows the case where the black mark 20 is close to the emitter 102 and the first and second detectors 104 and 106. In this case, the outputs of the first detector 104 and the second detector 106 are both a high logic level. FIG. 3e shows the case where the black mark 20 is close to the emitter 102 and the second detector 106 but not the first detector 104. In this case, the output of the first detector 104 is a low logic level and the output of the second detector 106 is a high logic level. FIG. 3f shows the last case in which the black mark 20 is far from the emitter 102 and the first and second detectors 104 and 106. In this case, the outputs of the first and second detectors 104 and 106 are both low logic levels. Accordingly, based on the outputs of the first and second detectors 104 and 106, the passage of the black mark 20 can be detected. In particular, the consumption detection signal 32 can be based on the logical AND of the first and second detection signals 110 and 112.

The use of two detectors allows for more robust operation of the sensor unit 100 and less false detections. For instance, there may be spurious detections by either the first detector 104 or the second detector 106 which may be due to dirt on the power meter unit 18 and the like. However, it is very unlikely that both detectors 104 and 106 will give a spurious detection at the same time. Furthermore, it is very unlikely that noise will trigger a detection if one requires that all five states happen sequentially before making a detection of the passage of the black mark 20 by the sensor unit 100.

In an alternative, the five states can be reduced to three states by subtracting the first and second detection signals 110 and 112 from one another and noting the change in sign in the subtraction signal. For instance, the subtraction result for each of the five states, beginning with the first state and moving sequentially to the last state and subtracting the second detection signal 112 from the first detection signal 110, is 0, 1, 0, −1 and 0. Accordingly, the transition from 1 to 0 to −1 signifies the passage of the black mark 20 past the sensor unit 100 and makes it very unlikely that glitches or noise will result in a false detection.

Figure 4:
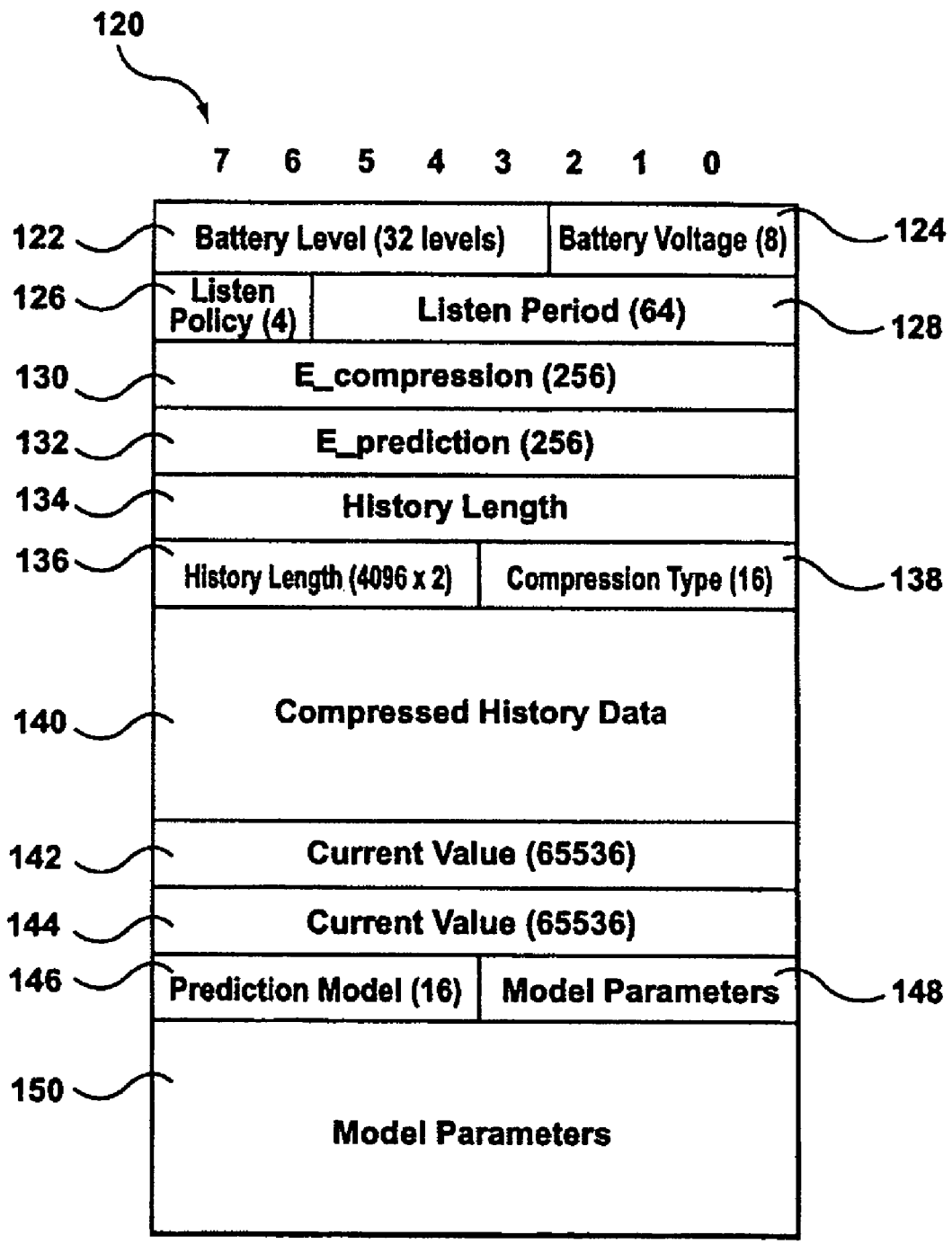
FIG. 4 is shows a data structure that may be used for transmitting data in the power meter reader systems of FIGS. 1 and 2.

Referring now to FIG. 4, shown therein is an example of a general transmission data structure 120 that may be used for transmitting data in either of the power meter reader systems 10 and 10'. This transmission protocol can be useful when the display unit is configured to interact with more than one detection unit (i.e. monitor the energy consumption of more than one structure) wherein each detection unit can operate in a different manner. In addition, other transmission data structures may be used that only have a portion of the fields contained in the transmission data structure 120. All efforts have been made to reduce the complexity and overhead of the transmission data structure 120 to reduce energy consumption in the detection unit 12. The transmission data structure 120 will not be effective if the overhead to transmit the data is greater than the data itself. The numerals 7 through 0 at the top of FIG. 4 signify the number of bits that are used to make up a particular piece of information in the transmission data structure 120.

The transmission data structure 120 comprises a battery level field 122, a battery voltage field 124, a listen policy field 126, a listen period field 128, an E_compression field 130, an E_prediction field 132, a history length 134, a first history length field 136, a second history length field 138, a compressed history data field 140, a first current value field 142, a second current value field 144, a prediction model field 146, a first model parameters field 148 and a second model parameters field 150. The battery level field 122 is sent for all transmissions made to the display unit 14. The battery level can be used to warn the end user of the display unit 14 that the detection unit 12 is getting low on power. Although some batteries have a sharp voltage drop curve as battery power dissipates, most batteries will give fair warning that they are getting low on power. The battery level field 122 is composed of 5 bits allowing for 32 distinctive levels of the battery voltage based on a linear scale.

The battery voltage field 124 shows an initial battery voltage for the power source 30. The initial battery voltage can be represented by eight values (i.e. 3 bits provide 000 sequentially through to 111). As an example, the following voltage levels can be represented: 1.2V, 1.5V, 2V, 2.4V, 3V, 3.6V, 4V and 6V. The initial battery voltage may also be coded in the display processing unit 54 since it is quite likely that the size of the battery used with the detection unit 12 is known a priori.

However, there may be several different styles of detection units 12 that can use different size batteries.

The listen policy field 126 indicates to the display unit 14 when to listen for messages from the detection unit 12. In an unpredictable scheme where transmission occurs whenever the prediction error value $\epsilon_{pred}$ is violated, the policy for the display unit 14 will most likely be set to always listen for transmissions. However, the detection unit 14 could set a short transmission window and only be able to broadcast during this time window (as set in the policy). In this case, the detection unit 12 has the option of whether to send data, set a new listening policy or do nothing at all during each window. However, if the detection unit 12 detects a violation of the compression error $\epsilon_{comp}$ too often and is running out of memory to store the data or the prediction error $\epsilon_{pred}$ is violated, the detection unit 12 has to wait for the next transmission window to send data. In the worst case this could result in erroneous data predicted by the display unit 14 and/or a loss of data by the detection unit 12. The detection unit 12 must also be careful not to set too long of a transmission period as memory overflow may occur in the detection unit 12 and data will be lost. The display unit 14 could use the policy to identify potential interference between multiple detection units 12 (i.e. two or more detection units that want to broadcast at exactly the same time). It would then be up to the display unit 14 to take the appropriate action to resolve the conflict. Although in a unidirectional communication situation it may be difficult to resolve the conflict without human intervention (in this case, the consumer would shut down the detection unit 12 and the display unit 14 to reset these units). As shown in Table 1, the policy could be to broadcast every n Minutes, n Hours or n Days, where n is defined by the listen period field 128. If the listen policy field 126 is set to a time period of Minutes, Hours or Days then the 6 bits in the listen period field 128 allow for a listening period between 1 and 64 of the specified time period (i.e. 1 to 64 minutes, 1 to 64 hours or 1 to 64 days).

TABLE 1

Values for the Listen Policy Field

| Code | Policy |
|---|---|
| 00 | Always |
| 01 | Minutes |
| 10 | Hours |
| 11 | Days |

The E_compression field 130 specifies the amount of compression error $\epsilon_{comp}$ between true sensor readings and the compressed values in the data that is transmitted. This value can range from 0 in the lossless case to up to 255 for a very lossy compression scheme. The value in the E_compression field 130 can be dynamically decided upon by the compression unit 48 during compression.

The E_prediction field 132 specifies the amount of prediction error $\epsilon_{pred}$ between the predicted values, due to the prediction model, and the actual values before updated values for the model parameters are transmitted by the detection unit 12 to the display unit 14. This value can range from 0, which is the case where any violation of the prediction will result in a transmission, up to 255. The value in the E-prediction field 132 can be dynamically updated by the prediction unit 46. For example, if the power source 30 is running very low, then this value may be increased so that fewer transmissions are made by the detection unit 12. However, it is important that the display unit 14 is aware of any possible error in the predicted values of energy consumption so that the consumer can be properly notified via a graphical output on the display 60.

The first and second history length fields 134 and 136 represent the length of data in the compressed history data field 148. The first and second history length fields 134 and 136 are specified by 12 bits in total to represent data lengths from 0 to 4096 data points. The minimum length 0 is specified when there is no data that is transmitted.

The compression type field 138 consists of 4 bits and specifies the type of compression used for the data in the compressed history data field 140. For example, if the first bit in the compression type field 138 is a 1, the delta of the predicted series and the compressed series is compressed. Alternatively, if the first bit of the compression type field 138 is a 0, then the raw sensor values are compressed. For different segments of a time series, different compression schemes may work better. Accordingly, the compression unit 48 can pick the best compression algorithm for a given potion of data and represent the particular compression algorithm in the compression type field 138. However, memory limitations in the detection unit 12 may not allow large blocks to have variable compression schemes. The various compression schemes that can be used are represented in table 2 (currently two entries are reserved for using other different types of compression). The entry NONE indicates that no compression is used.

TABLE 2

Types of data compression

| Code | Compression |
|---|---|
| 0000 | NONE |
| 0001 | PMC-Raw |
| 0010 | Reserved |
| 0011 | PMC-Delta |
| 0100 | Reserved |

The compressed history data field 140 is the compressed data that is collected by the detection unit 12. The length of the data in the compressed history data field 100 is specified in the history length fields 134 and 136 (to a max of 8192 bytes) and the type of compression used is specified in the compression type field 138. As mentioned previously, the data in the compressed history data field may be a series of values for the prediction model parameters or may be the actual raw data. This is useful in situations where the system 10 or 10' is configured for long times in between data transmissions. For example, this may be once per day and the consumer does not want real-time updated data but the consumer does want to see what happened with power consumption at various times during the day.

The current value fields 142 and 144 represent the latest absolute non-compressed current reading from the detection unit 12. This value represents the cycle count up to (i.e. absolute cycle count) the latest detected revolution of the power meter unit 18 prior to the current data transmission. If a time index is necessary, then the time index should be added to the data in the compressed history field 140.

TABLE 3

Meanings for values in the Current Value Fields

| Code | Meaning |
|---|---|
| 0x0000 . . . 0xFFFE | Sensor Reading |
| 0xFFFF | No value |

The prediction model field 146 indicates the type of prediction model used by the display unit 14 to predict the values between transmissions from the detection unit 12. Exemplary representations in the prediction model field 146 are shown in Table 4. The entry NONE indicates that no prediction is used.

TABLE 4

Meanings for values in the Prediction Model Field

| Code | Prediction |
| --- | --- |
| 0000 | NONE |
| 0001 | Last |
| 0010 | Linear |
| 0011 | Reserved |

The model parameters field 148 provides the values for the prediction model parameters that were generated by the prediction unit 46 according to the chosen prediction model. However, if the prediction model field 148 specified that the prediction model is NONE, then all but the first four bits of this message will be encoded.

The transmission data structure 120 shown in FIG. 4 gives no indication of the error-correcting code (ECC) that is to be used during data transmission. A strong ECC will have to be used in the case of unidirectional communication if the detection unit 12 does not resend its information. Otherwise the data sent by the detection unit 12 may not be recoverable. Some examples of ECC include convolutional encoding and checking such as VITERBI algorithms. The ECC works with an error detection code. In one instance, CRC data can be added to the data transmitted and then used at the receiver to provide error checking on the transmitted data. First the ECC is used to fix potential errors but if there are more errors than can be corrected the CRC is a fail safe mechanism to throw out the message.

Figure 5:
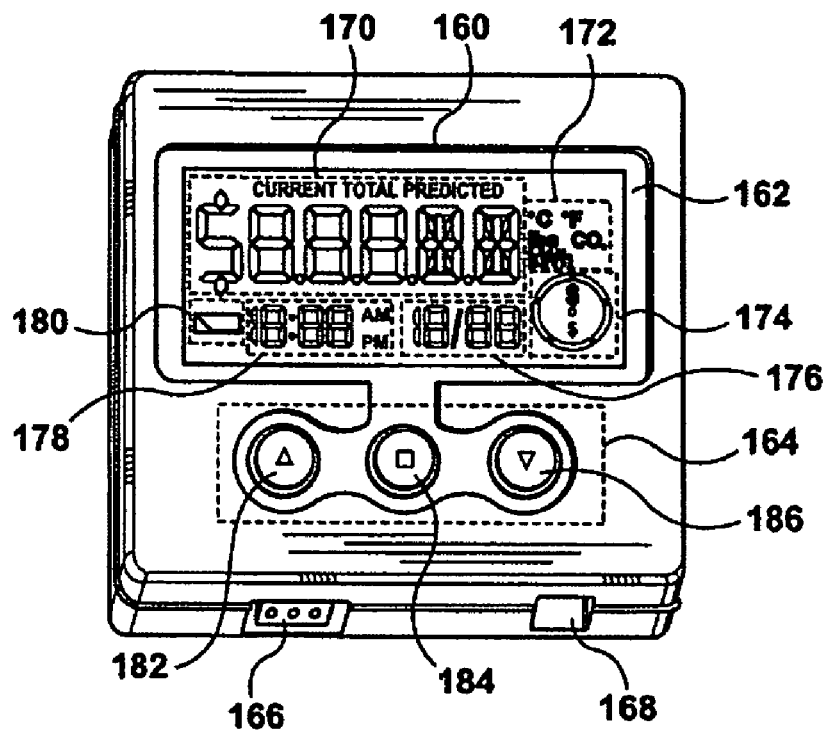
FIG. 5 is a front view of an exemplary physical embodiment of a display unit that can be used with the power meter reader systems of FIGS. 1 and 2.

Referring now to FIG. 5, shown therein is a front view of an embodiment of the display unit 160 that can be used with either of the power meter reader systems 10 and 10'. The display unit 160 includes a display 162, a keypad 164, a communication port 166 and a power connection port 168. The display 162 includes a number of display fields: a quantity display field 170, a unit display field 172, a power meter disk display field 174, a date display field 176, a time display field 178 and a low battery indicator field 180. The quantity display field 170 displays a numerical quantity such as the quantity of power consumption or the temperature. The quantity display field 170 can display a $ symbol when displaying power consumption in a dollar amount. The quantity display field 170 may also display icons that indicate whether the quantity being displayed is for current energy consumption, total energy consumption or future predicted energy consumption. The unit display field 172 displays an appropriate unit for the quantity being displayed in the quantity display field 170. The unit display field 172 can display the following units: ° C., ° F., lbs $CO_2$, kWh, etc. The power meter display field 174 displays a digital representation of the power meter unit 18 including the black mark 20. The digital representation of the power meter unit 18 rotates at the same speed that the actual power meter unit 18 rotates. This field can also provide a relative indication of the amount of energy consumption, such as a big dollar sign or a little dollar sign, to signify whether there is currently a large or small amount of energy that is being consumed. The date display field 176 displays the current date and the time display field 178 displays the current time. The low battery indicator field 180 can provide a display of a battery that is almost empty to indicate that the detection unit 12 is running out of power.

The keypad 164 includes an up-scroll key 182, a down-scroll key 184 and a select key 186. The up-scroll and down-scroll key 182 and 184 allow the user to scroll through different options such as scrolling through the type of numerical data that is to be displayed on the display 162, or scrolling through the different locations so that the consumer may select the location in which the power meter reader system is being used, etc. The select key 184 is used to select one of the options.

The communication port 166 is used to connect the display unit 160 to a computer or another suitable computing device, as described in the description of the power meter reader system 10'. The power connection port 168 is used to connect the display unit 160 to a power source. Most likely, an adaptor may be used to connect the display unit 160 to an electrical outlet.

Figure 6A:
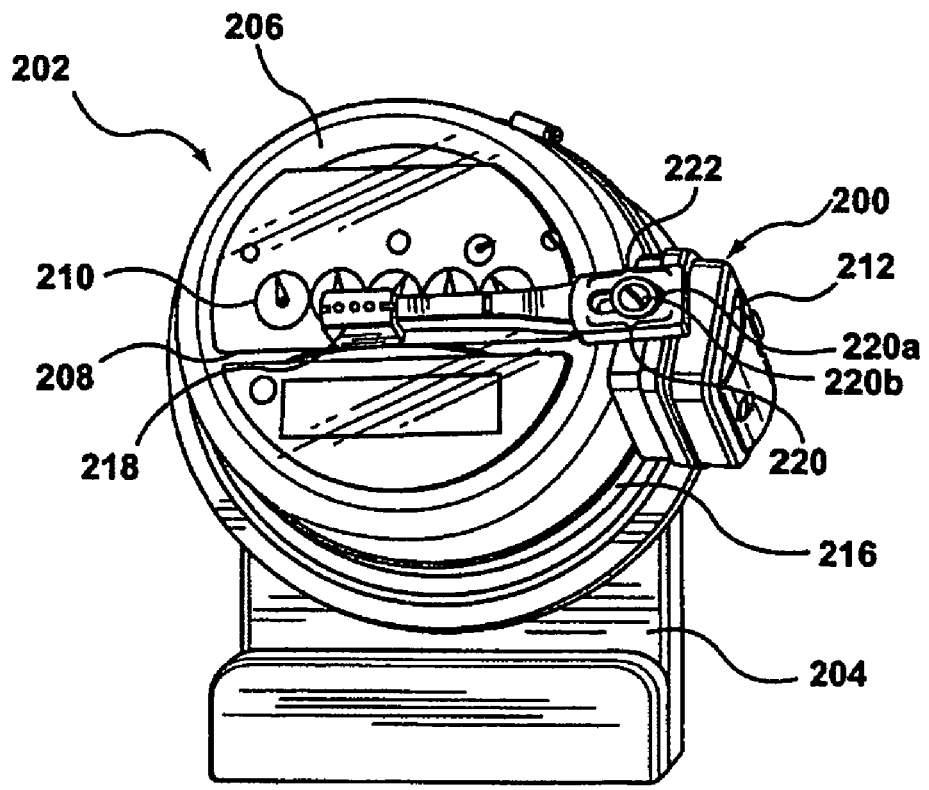
FIG. 6a is a front view of an exemplary physical embodiment of a detection unit attached to a power meter that can be used with the power meter reader systems of FIGS. 1 and 2.
Figure 6B:
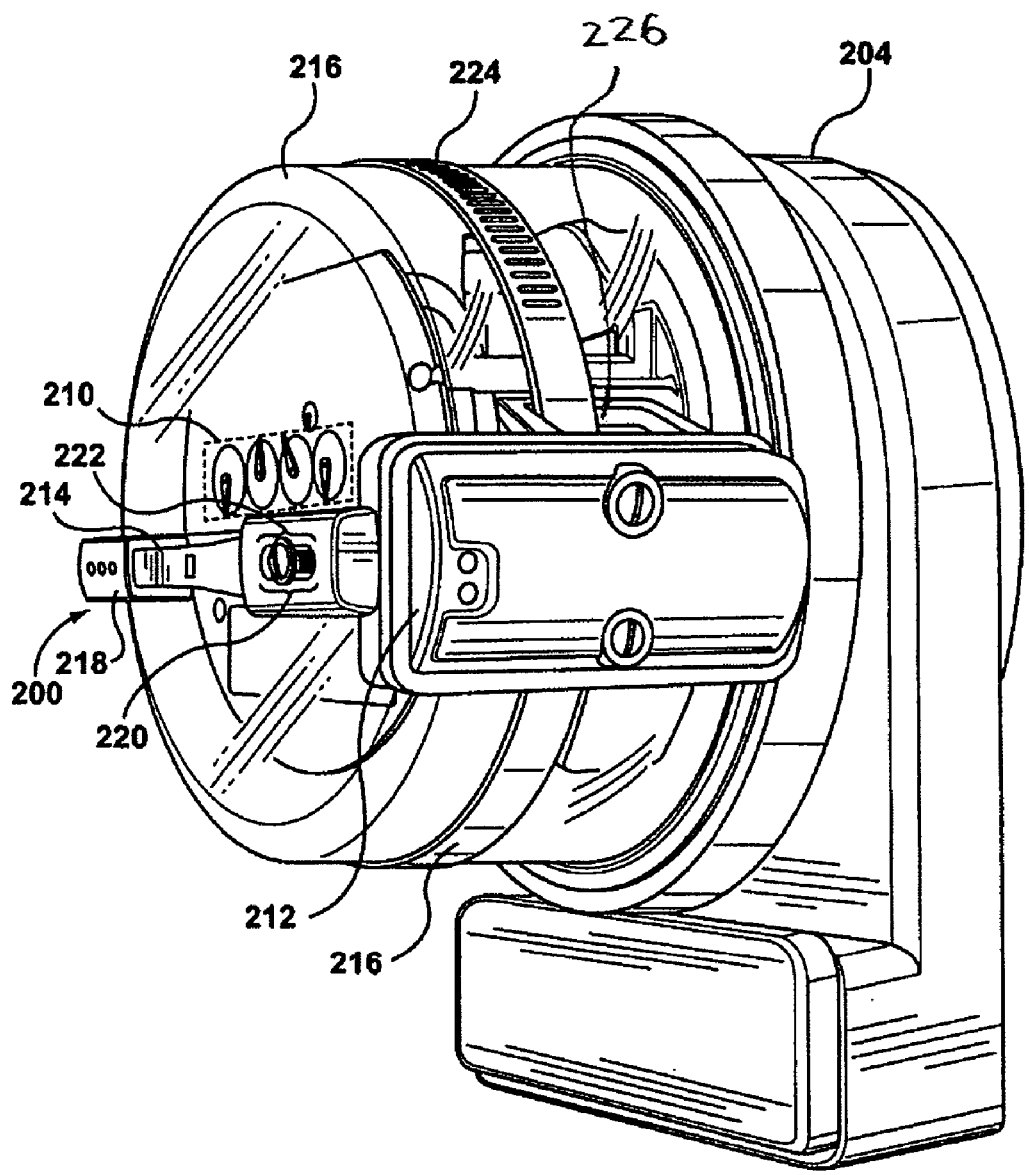

Referring now to FIGS. 6a, and 6b, shown therein are views of an exemplary physical embodiment of a detection unit 200 of the power meter reader system attached to a power meter 202. The power meter 202 is a conventional meter with a durable outer casing 204, a cover 206, a power meter disk 208 and a plurality of dials 210. The cover 206 is made of glass or plastic, has circular sidewalls with a flat front face and is transparent to allow an individual to read the dials 210 which indicate power consumption. The power meter disk 208 is usually made from aluminum or another suitable metal, and is flat with a black mark at a predetermined location along its outer edge. The power meter disk 208 rotates about a vertical axis at a rate that is dependent upon the current drawn by the structure which is being monitored by the power meter 202; the more current that is used, the faster the power meter disk 208 rotates. The power meter 202 is sealed to provide protection from the elements and to prevent tampering with the power meter disk 208 and the dials 210. The power meter 202 is of conventional construction the inner workings are known by those skilled in the art. It should be noted that the power meter 202 is shown for exemplary purposes and that the display unit 200 can be mounted to other different power meter designs.

The detection unit 200 has been specially designed to fit and work with different shapes and sizes of power meters. The detection unit 200 has also been specially designed so that it does not block the power meter disk 208, the dials 210 or the serial number when it is attached to the power meter 202 so that a person from the utility company can read the power meter 202 if needed. The detection unit 200 includes a main body 212, an extension member 214 and an attachment means 216 for attaching the detection unit 200 to the power meter 202. The main body 212 houses most of the electronics of the detection unit 200.

The extension member 214 houses at least a portion of the sensor unit 22 (i.e. the LED emitter and detector, and associated circuitry) in a head region 218. The extension member 214 also includes a longitudinal extension means 220 and a pivot means 222 for positioning the sensor unit 22 over the power meter disk 208. In this embodiment, the longitudinal extension means 220 comprises a slot 220a and a fastener 220b (in this case a screw for example, although other suitable fasteners may be used). The extension member 214 is extended over the face of the power meter 200, via the longitudinal extension means 220, until the head region 218 of the power meter 200 is directly over an appropriate region of the power meter disk 208. In particular, the head region 218 is preferably located so that the sensor unit 22 lies directly over the center of the power meter disk 208 because this is the location at which the black mark on the power meter disk 208 comes closest to the front face of the power meter 202. Accordingly, this is the point at which the SNR of reflected signals will be highest for the sensor unit 22. The fastener 220b is then placed through the slot 220a to engage a borehole 220c (see FIG. 6c) in the main body 212 to maintain the extension member 214 with a certain amount of extension and at a certain angle with respect to the main body 212. In this embodiment, the fastener 220b and the borehole 220c also provide the pivot means 222. The extension member 214 can be placed at an angle other than 90 degrees (as is currently depicted in FIGS. 6a and 6b) with respect to the main body 212. It should be understood by those skilled in the art that other implementations are possible for the longitudinal extension means 220 and the pivot means 222. For instance, the extension member 214 can include a telescopic section for implementing the longitudinal extension means 220.

The attachment means 216 is used to attach the detection unit 200 to the power meter 202. In this embodiment, the attachment means 216 includes a hose clamp 224 that slideably, releasably engages a loop member 226 on the main body 212 and extends around the perimeter of the power meter 202 to secure the detection unit 200 to the power meter 202. The hose clamp 224 is preferably made from a durable material that is either flexible (or thin enough to be flexible) such as steel. The hose clamp 224 has a series of serrations so that the clamping portion (not shown) can attach at a number of positions to accommodate power meters 202 with a variety of different diameters. However, in general, any appropriate clamping means can be used for the attachment means such as clamps that include a lever, a latch (such as an over-center latch), or a ratchet means for providing a tight fit for the attachment means.

Figure 6C:
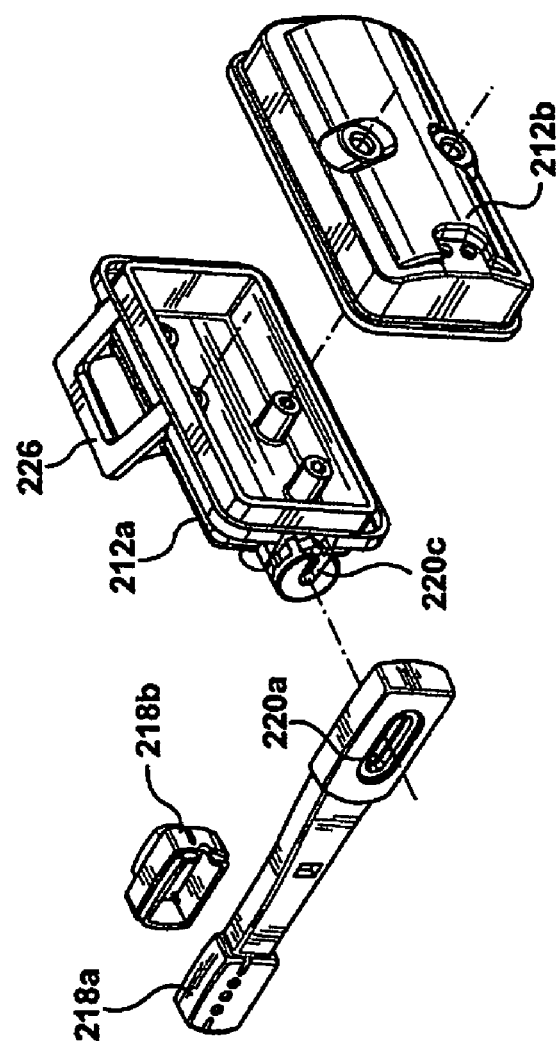

Referring now to FIG. 6c, shown therein is an exploded isometric view of the main body 212 and the extension member 214 of the detection unit 200 of FIG. 6a. The main body 212 includes a first piece 212a and a second piece 212b which are molded to provide a friction fit with one another. The head region 218 includes a first piece 218a and a second piece 218b that are also molded to provide a friction fit with one another. The electronics of the sensor unit 22 are housed between the first piece 218a and the second piece 218b. The electronics of the remainder of the detection unit 200 are housed between the first piece 212a and the second piece 212b.

Figure 7:
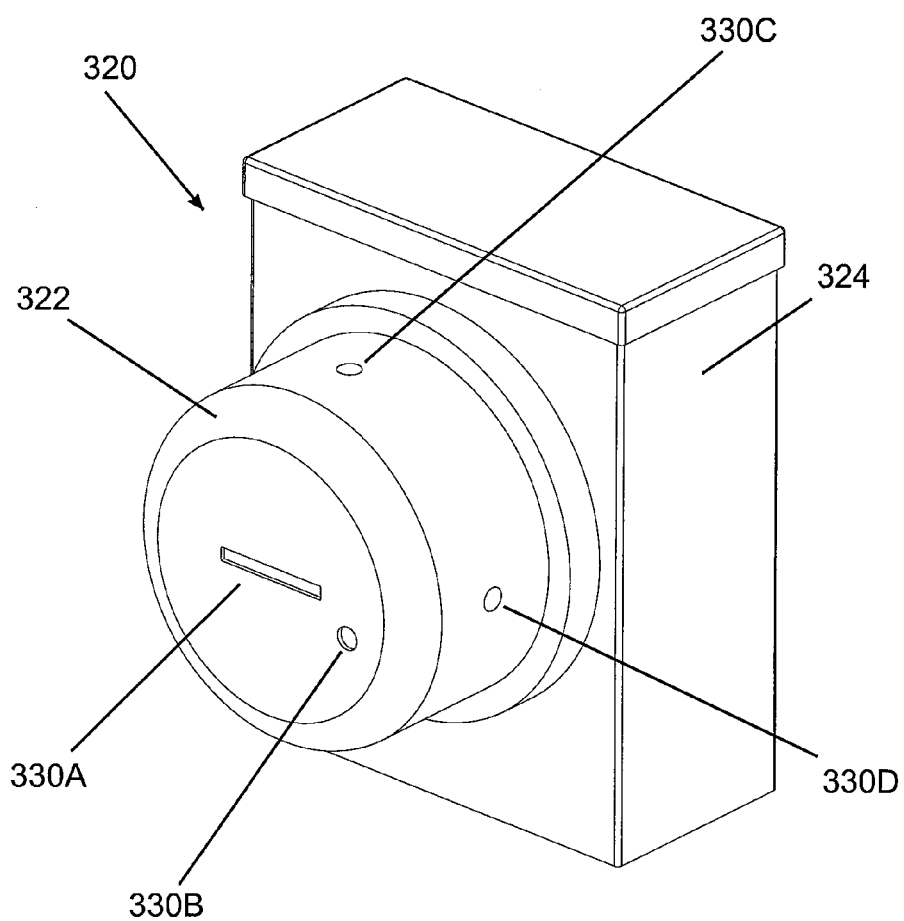
FIG. 7 is a perspective view of a power meter showing examples of different output locations for indicating power usage.
Figure 8:
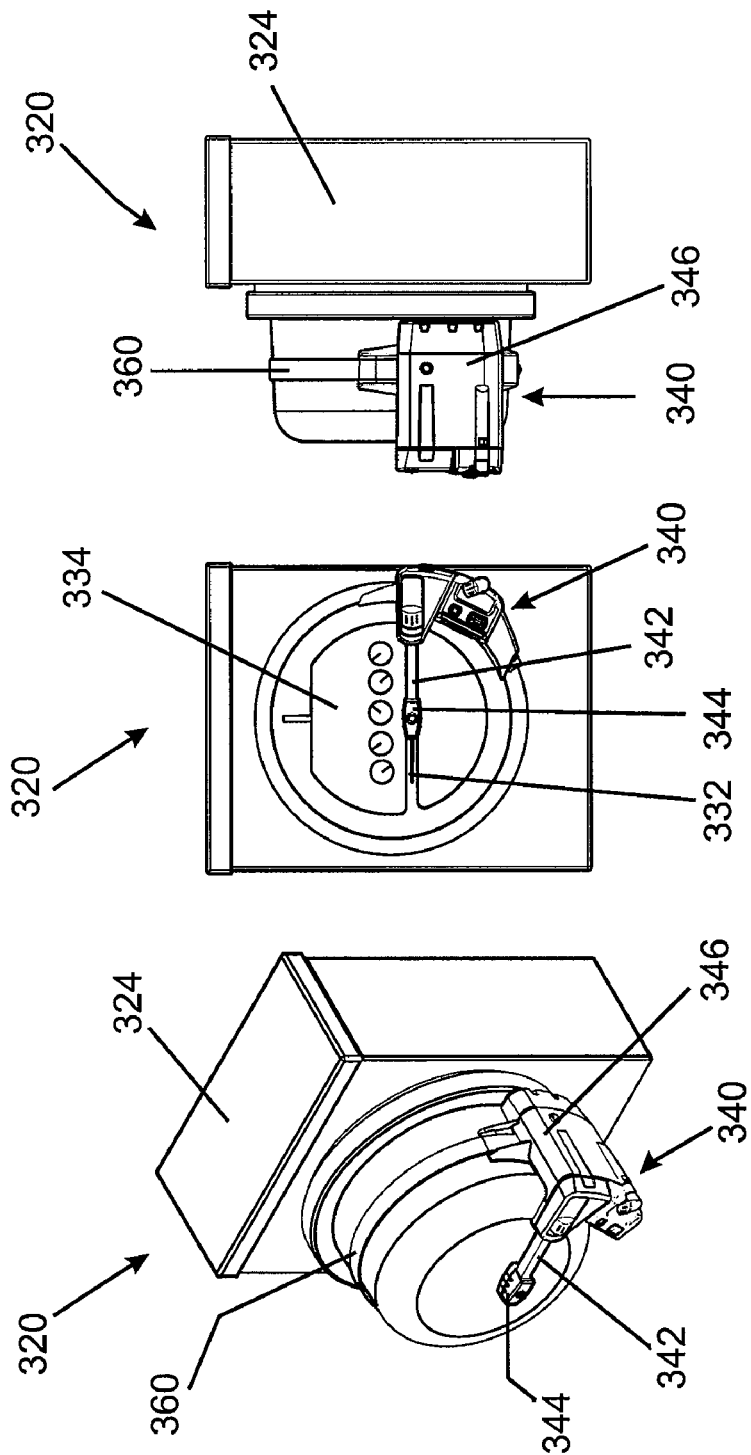
Figure 9:
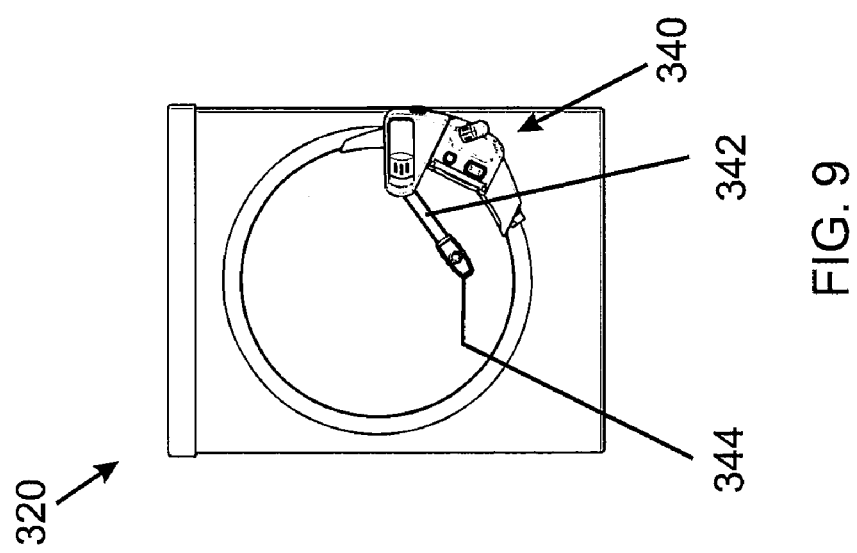
FIG. 9 is a front view of a detection unit of FIG. 8a attached to a power meter in a pivoted configuration.
Figure 10C:
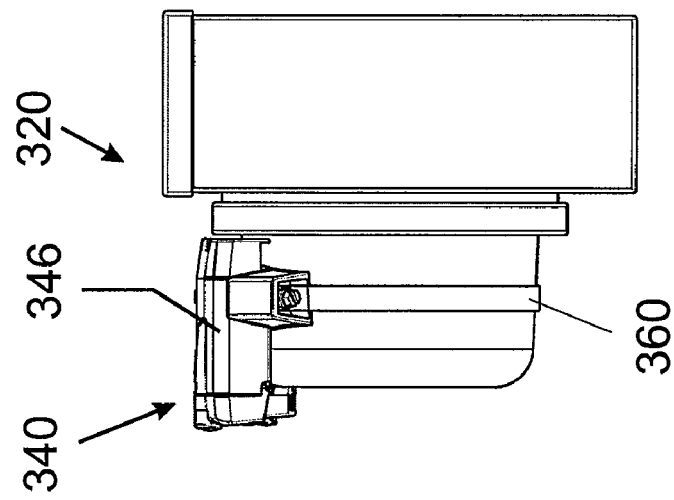
Figure 10B:
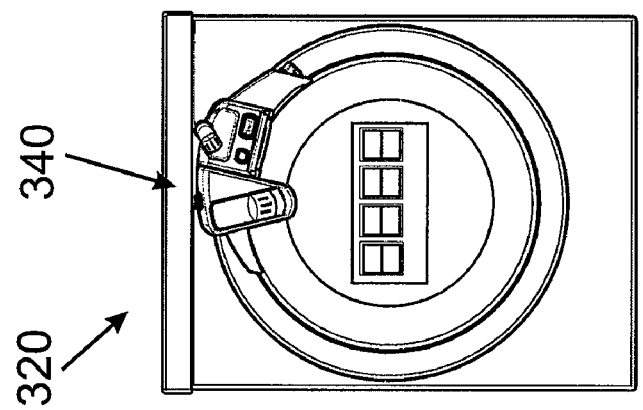
Figure 10A:
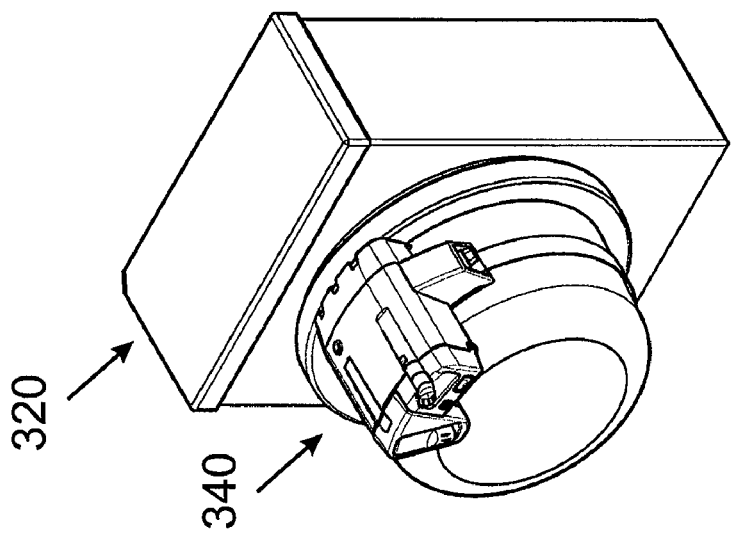
FIG. 10a is a perspective view of a detection unit of FIG. 8a attached to a power meter in a folded configuration.

Referring now to FIG. 7, shown therein is a power meter 320 showing four output locations 330A, 330B, 330C and 330D for indicating power usage. The power meter 320 generally corresponds to the power meter 220, except for having different output locations. These four output locations are examples of the range of locations at which detection unit 340 (shown in FIGS. 8a to 12) is capable of reading. More specifically, FIGS. 8a to 8c show another alternative physical embodiment of a detection unit 340 in a projected configuration, capable of reading an output at location 330A. FIG. 9 shows detection unit 340 in a pivoted configuration, capable of reading an output at location 330B. FIGS. 10a to 10c show detection unit 340 in a folded configuration, capable of reading an output at location 330C. The detection unit 340 in the folded configuration shown in FIGS. 10a to 10c can be easily arranged to read an output at location 330D.

The detection unit 340 is designed to fit and work with different shapes and sizes of power meters. Typically, if the power meter is electromechanical and contains a power meter disk 332, the detection unit 340 will read the output in the projected configuration (as shown in FIGS. 8a to 8c). The pivoted and folded in configurations of the detection unit 340 (as shown in FIGS. 9, and 10a to 10c) are typically used for power meters with outputs at different locations, as described in further detail below.

As shown in FIGS. 8a to 8c, the detection unit 340 is designed so that it does not block the power meter disk 332, the dials 334 or the serial number when it is attached to the power meter 320 so that a person from the utility company can read the power meter 320 if needed.

The detection unit 340 includes a main body 346, an extension member 342 and an attachment means 360 for attaching the detection unit 340 to the power meter 320. The main body 346 houses most of the electronics of the detection unit 340 and is typically made of a suitable plastic, such as LEXAN™ for example, although other material may be used.

The extension member 342 houses the at least a portion of the sensor unit 22 in a head region 344. The extension member 342 is extended over the face of the power meter 320 until the head region 344 of the power meter 320 is directly over an appropriate region of the power meter disk 332. In particular, the head region 344 is typically located so that the sensor unit 22 lies directly over the center of the power meter disk 332 because this is the location at which the black mark on the power meter disk 332 comes closest to the front face of the power meter 320. Accordingly, this is the point at which the signal to noise ratio of reflected signals are the highest for the sensor unit 22.

Figure 11:
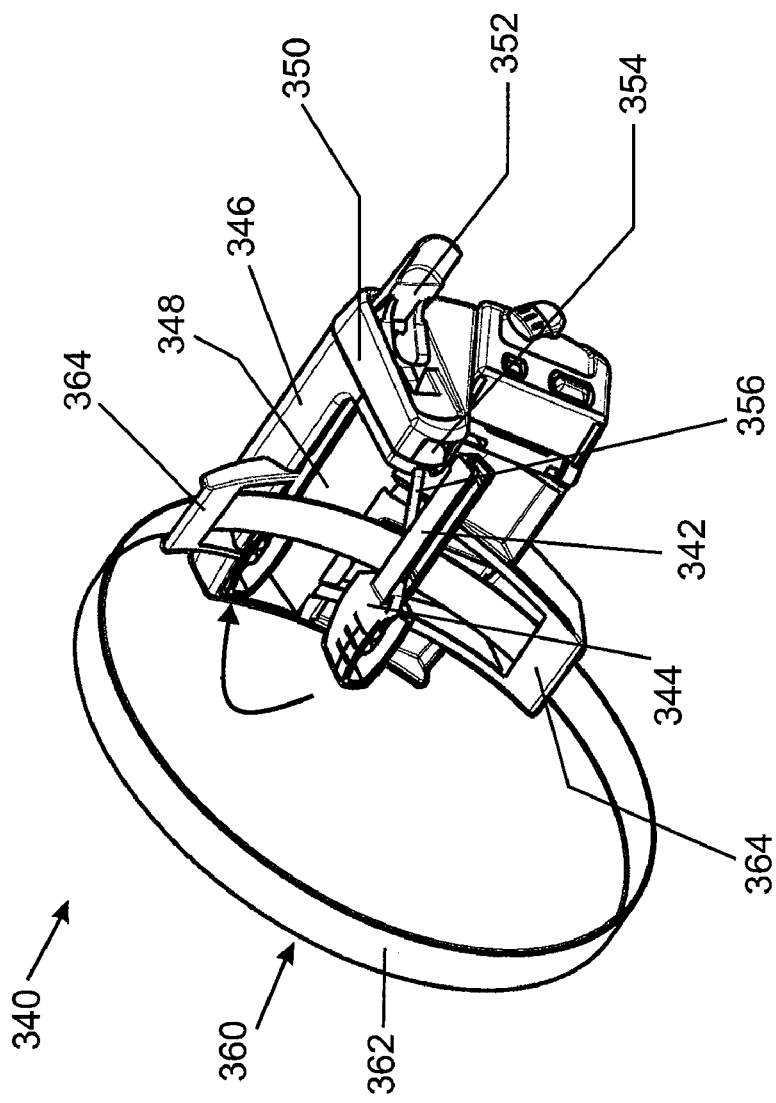
FIG. 11 is a perspective view of the detection unit housing of FIG. 8a in a folded configuration.
Figure 13:
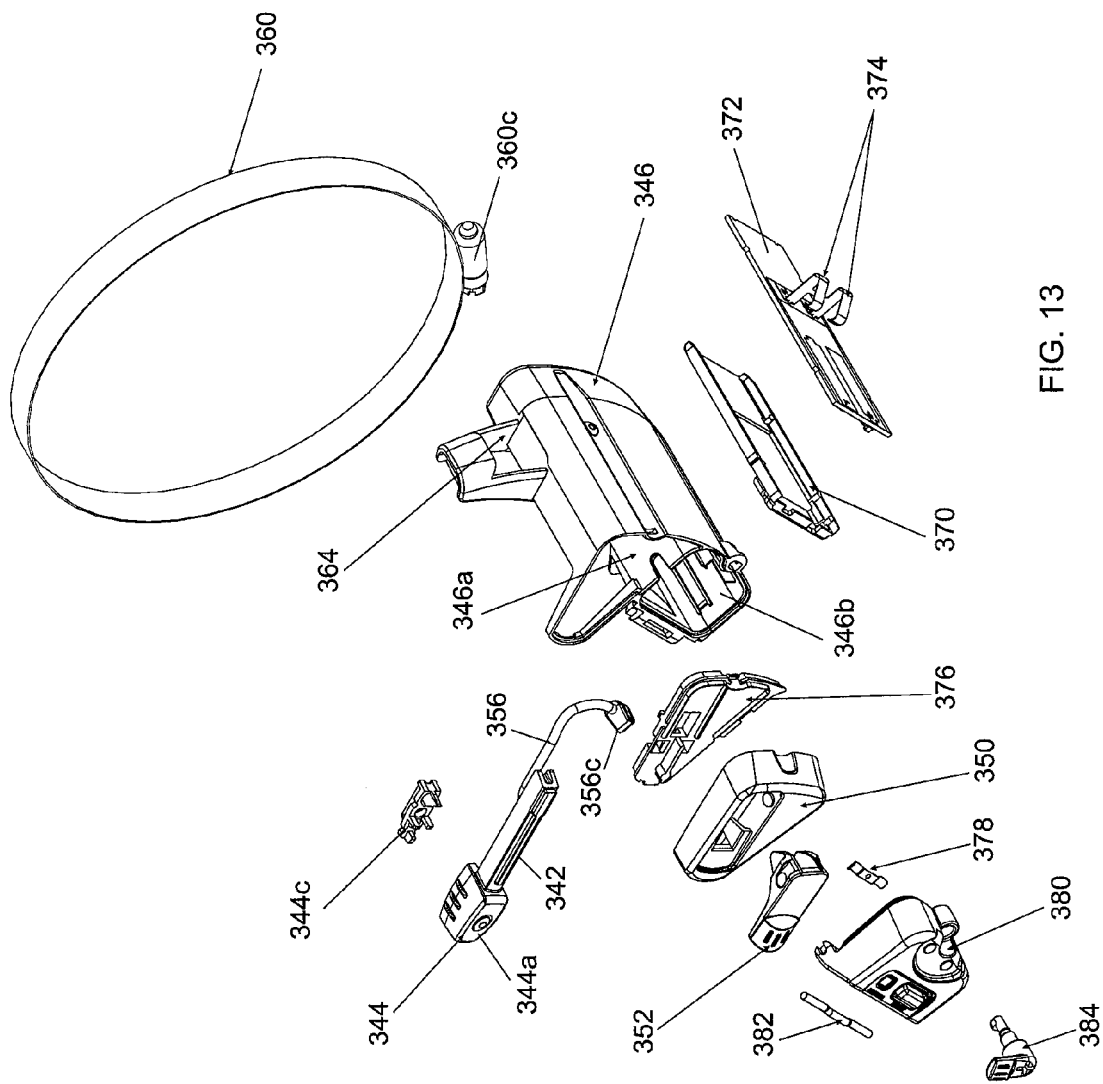

Referring to FIGS. 11-13, the extension member 342 also includes a longitudinal extension means for positioning the sensor unit 22 over the power meter disk 332. The extension means comprises an extension support member 350, which maintains the extension member 342 with a certain amount of extension with respect to the main body 346. Specifically, when latch 352 is in the open position, it allows free movement of extension member 342 in a channel or socket 354 provided by the extension support member 350. When the latch 352 is in the closed position (folded down) it puts pressure on the extension means and holds it in place by friction. It should be noted that the extension member 342 can be removably held in place in other ways; for instance, the extension member 342 may make a friction fit in the socket 354 provided by the extension support member 350. Alternatively, the extension member 354 may include teeth, texturing or over-molded rubber to help lock the extension member 354 in the desired position.

Referring now to FIG. 9, shown therein is a front view of the detection unit 340 of the power meter reader system attached to a power meter 320 in a pivoted configuration. The combination of the extension member 342 and the extension support member 350 provides a pivoting means for positioning the senor unit 22 over an output location such as 330B, as shown in FIG. 7. More particularly, the pivoting means comprises the extension support member 350, the socket 354 and the width of the extension member 342 relative to the width of the socket 354. The socket 354 is larger than the width of the extension member 342 providing a free-play distance equal to the difference in size, such that one may pivot the extension member 342 within socket 354 of the extension support member 350. As the extension member 342 is extended further, the amount of pivot will increase, and as the extension member is slid further into the socket the amount of pivot will decrease. The relationship for pivot movement is roughly equal to an $TAN^{-1}$ relationship (i.e. free-play/arm-length inside socket). In a similar fashion for adjusting the amount of extension for the extension member 342, the latch 352 allows pivoting movement of the extension member 342 when the latch 352 in the open position and secures the extension member 342 when the latch 352 is in the closed position.

It should be understood by those skilled in the art that other implementations are possible for the extension means and the pivot means. For instance, the extension means can include a telescopic element for extending the length of the extension member 342. Further, the pivot means may include a screw, and the extension member 342 may include a borehole that can be used to secure the position of the extension member 342 once it has been pivoted into the desired location. Further, the free-play between the width of the socket 354 and the width of the extension support member 350 can be increased, to support a larger degree of pivoting if needed. The socket 354 may also be designed such that the walls of the socket 354 have curves or recesses, and the extension member 342 may be designed with thicker or thinner sections such that the amount of pivoting is increased or decreased for various extension lengths. In an alternative embodiment, the end of the extension member 342 that is received by the socket 354 can have a ball-shape and the socket 354 can have a similar sized rounded shape such that the extension member 342 would only pivot when the ball of the extension member 342 clicks into place in the socket 354 dictated by the amount of free-play between the widths of the socket 354 and the extension support member 350.

Referring now to FIGS. 10a to 10c, shown therein are views of the detection unit 340 in a folded configuration and attached to a power meter 320. As shown, the folded configuration is used to place the sensor unit 22 over an output location on the periphery of the cover 322 of the power meter 320 (such as locations 330C or 330D in FIG. 7). In the folded configuration, the extension member 342, including head region 344, is tucked against the interior of the housing of the detection unit 340. In this particular exemplary configuration, a recess 348 (shown in FIG. 11) in the interior of the main body 346 of the detection unit 340 is provided to receive the extension member 342 to provide a more compact fit when the detection unit 340 is mounted to the power meter 320. Once in the folded configuration, the detection unit 340 may then be slid onto or otherwise rotated around the circular glass enclosure of the cover 322 so that the sensor unit 22 aligns with a particular output location.

Referring now to FIG. 11, shown therein is a detailed view of the inner surface of the detection unit 340. As shown, in the folded configuration, the extension member 342 is removed from the socket 354 of the extension support member 350. To allow the detection unit 340 to be configured in the folded configuration, the latch 352 is placed in its open position so that the extension member 342 can be slid out of the socket 354 of the extension support member 350. However, the extension member 342 is still connected to the detection unit 340 by a cable 356 so that data can be transmitted from the sensor unit housed in the head 344 region of the extension member 342. The housing of the detection unit 340 can also include a recess 348 for receiving the extension member 342. Various shapes are possible for the recess 348 including a shape that is complementary to the shape of the extension member 342 to provide a friction fit (see FIGS. 12a-12d).

The attachment means 360 is used to attach the detection unit 340 to the power meter 320. In this exemplary embodiment, the attachment means 360 includes a hose clamp 362 that slideably, releasably engages at least one loop member 364 on the main body 346 and extends around the perimeter of the power meter 320 to secure the detection unit 340 to the power meter 320. The hose clamp 362 is preferably made from a durable material that is either flexible (or thin enough to be flexible), such as steel. The clamping portion 360c (see FIG. 13) of the hose clamp 362 can be used to vary the diameter of the hose clamp 362 so that the detection unit 340 can be attached to various power meters having a variety of different diameters. In general, any appropriate clamping means can be used for the attachment means such as clamps that include a lever, a latch (such as an over-center latch), or a ratchet means for providing a tight fit for the attachment means. A clamp-like band made from a suitable type of nylon or rubber can also be used for the attachment means 360. In alternative embodiments, other types of attachment means may be used such as double-sided tape or other suitable adhesives.

Referring to FIGS. 12a to 12d, shown therein are perspective views of the detection unit 340 showing the steps for moving the position of the extension member 342, which contains at least a portion of the sensor unit 22, into the folded configuration. FIG. 12a shows the detection unit 340 in the projected configuration. From the projected configuration, the latch 352 is opened and the extension member 342, including head region 344, is removed from the socket 354 (see FIG. 12b). For clarity, certain details of the detection unit 340 are not shown, such as the cable 356 and the attachment means 360. The extension member 342 is then flipped around and placed in the extension member recess 348 of the main body 346 in such a way that the sensor unit 22, located in head region 344, faces away from the inner surface of the housing of the detection unit 340. Accordingly, once the detection unit 340 is placed onto the power meter 320, the sensors in the sensor unit 22 will face into the periphery of the cover 322 of the power meter 340 (see FIGS. 12c and 12d). In an alternative, there may be sensors on both sides of head region 344, which would eliminate the need to twist the extension member 342, as shown in FIG. 12b. Further, only the sensors on the side of the head facing the power meter 320 are enabled. FIG. 12d shows the detection unit 340 in the folded configuration.

The recess 348 can have a substantially similar shape to extension member 342 such that the recess 348 tightly secures the extension member 348. Alternatively, the recess 348 can be shaped to allow for movement of the extension member 342 so that the position of the sensor unit 22 can be adjusted to line up with the output location of the power meter 320. For example, the recess 348 can have a region that has the same width as the head region 344 of the extension member 342, to provide a friction fit but have a longer length to allow the extension member 342 to be moved up or down. Other variations are also possible. In each of these cases, the extension member recess 348 can be made from conformal foam in which the extension member 342 is placed in a friction fit. However, it should be understood by those skilled in the art that the extension member 342 can be secured in the recess 348 by any other suitable means. For example, rather then have a suitably shaped recess, the detection unit 340 may include somewhat flexible prongs or flanges that are spaced to slideably and releasably receive a portion of the extension member 342 in a friction fit.

Referring now to FIG. 13, shown therein is an exploded view of the housing of detection unit 340. The attachment means 360 attaches to the main body 346 by engaging the loop members 364 (only one is shown). The extension member 342 includes the head region 344, the sensor unit 22 (not shown), an aperture 344a for allowing the sensor unit 22 to emit or receive a light signal, and a cradle 344c for holding at least a portion of the sensor unit 22, such as the LED emitter and detector, plus any associated circuitry and wire connections that are required. The extension member 342 further includes the cable 356 with a connector 356c to connect the sensor unit 342 to the remainder of the electronics of the detection unit 340 housed within the main body 346.

The housing for the detection unit 340 also includes a PCB cradle 370 to receive a printed circuit board 372 that includes the remainder of the electronics and slides into the main body 346. The printed circuit board 372 also includes battery contacts 374 for receiving batteries.

The housing also includes a base plate 376 which makes a friction fit on the first region 346a of the main body 346. The extension support member 350 makes a friction fit onto the base plate 376. The clamp 352 is then pivotally connected to the extension support member 350. The connection 356c is then connected to a corresponding connection on the PCB cradle 370, and the extension member 342 is then slid into place in the extension support member 350.

A housing lid 380 is placed beside the extension support member 350 and attached to a second region 346b of the main body 346 with a hinge pin 372 and a lid tab 384. The housing lid 370 enables access to the main body 346 for example to facilitate the replacement of batteries (not shown), which are housed inside main body 346. Accordingly, the housing lid 370 includes a battery contact strap 378, which connects the batteries together to complete the circuit thereby providing energy to the detection unit 340 when the housing lid 370 is closed. The lid tab 384 snaps into place on the housing lid 370 such that the lid tab 384 can rotate. To lift the housing lid 370, the lid tab 374 can be rotated to the left so that a portion of the lid tab 374 extends beyond the edge of the housing lid 370 so that a user can grab this portion of the lid tab 374 and lift the housing lid 370.

In another embodiment, the detection unit 200 may contain an additional sensor unit located along the inner surface of the housing. This additional sensor unit can be used to read an output located on the periphery of the cover 322 of the power meter 320.

It should be understood that while the detection units 200 and 340 are shown with both an extension means and a pivot means, in other embodiments, these detection units can be designed to have either an extension means or a pivot means.

It should be understood by those skilled in the art that while the power meter 16 described herein is an electromechanical meter, the power meter reader system described herein may also work with a digital power meter unit. Digital power meter units provide an output that emulates the rotation of the power meter disk. The output is usually on an LED or LCD screen and could be a mark that rotates, or flashes or travels horizontally at the same rate as the black mark on the power meter unit 18 would rotate. In each of these cases, the sensor unit 22 can be used to sense the movement of the mark. Accordingly, in general, the power meter reader described herein, and more particularly the sensor unit 22, monitors a cyclical property of an indication on a power meter reader that has a varying period that indicates power consumption. The cyclical property could be the rotation of the black mark on the power meter disk, the flashing of a mark on an LED screen, the rotation of a mark on an LED screen or any other repetitive movement of the mark on the LED screen. In these cases, the sensor unit 22 still operates in a sleep mode when before and after the mark indicates the completion of one cycle that is similar to one cycle or rotation of the power meter unit 18.

In addition, in another alternative, the digital power meter may emit infrared energy that indicates the power consumption of the structure. In this case, the sensor unit 22 does not emit infrared energy. Rather, the receiver of the sensor unit 22 operates using a sleep mode and tracking to reduce power consumption, while detecting rotations of the simulated power meter disk. The remainder of the power meter system works as previously described. Further, the transmission protocol that is used to reduce power consumption does not depend on whether the power meter unit is electromechanical or digital.

It should also be understood that power meters 320 may have other types of output such as ultra-violet, visible light, sound, ultra-sound, magnetic energy, reflective or transflective liquid crystal displays, or other means of indicating power consumption with a cyclical property indicative of the power consumption of the structure. The power meter reader described herein can be modified to read these various types of outputs. Further, the various housing structures described herein can be used to attach the power meter reader to these different types of power meters.

In one aspect, at least one embodiment described herein provides a detection unit that is mounted to the power meter unit and a display unit that is remotely located with respect to the detection unit; one possibility is to mount the display unit within the structure for which the power meter unit is monitoring energy consumption. The detection unit monitors the indication of power consumption on the power meter (which is usually the rotation of the power meter disk of the power meter) and provides information related to the power consumption to the display unit. The display unit then displays the power consumption information to a consumer who is responsible for the power consumption of the structure. The display unit can provide a variety of information such as power consumption in a kW/hr or in a dollar amount (or another foreign currency) as well as the greenhouse gas that is being emitted due to the power usage.

The detection unit provides one or more energy efficient features for reducing its own energy consumption. For instance, the detection unit can enter a sleep mode during certain time intervals while detecting the power consumption indicated by the power meter unit. Alternatively, or in addition, the detection unit can generate a prediction model that represents information related to the power consumption and transmit the prediction model parameters, rather than raw data, to the display unit which uses the prediction model parameters to show power consumption (this may be done in real-time). This reduces the amount of data that is transmitted to the display unit. This also reduces the amount of transmissions that are sent to the display unit since data need only be transmitted when the values of the prediction model parameters change.

In another aspect, at least one embodiment described herein provides a power meter reader system for automatically reading a power meter unit mounted on a structure that is consuming power. The power meter unit includes an indication with a cyclical property having a period that varies at a rate indicative of power consumption of the structure. The system comprises a detection unit mounted on the power meter unit for monitoring the power consumption. The detection unit comprises a sensor unit disposed adjacent to the power meter unit for monitoring the cyclical property of the indication and generating a consumption detection signal; a processing unit connected to the sensor unit for receiving the consumption detection signal and generating an information signal, the processing unit further generating a sensor enable signal to enable the sensor unit for only a portion of the cyclical property of the indication, the portion coinciding with a time interval indicating the completion of one period of the cyclical property, the time interval being shorter than the period of the cyclical property; and, a transmitter connected to the processing unit for receiving the information signal and transmitting a transmission signal. The power meter reader system further includes a display unit located remotely with respect to the detection unit. The display unit receives the transmission signal and displays the power consumption.

In another aspect, at least one embodiment described herein provides a power meter reader system for automatically reading a power meter unit mounted on a structure that is consuming power. The power meter includes an indication with a cyclical property having a period that varies at a rate indicative of power consumption of the structure. The system comprises a detection unit mounted on the power meter unit for monitoring the power consumption. The detection unit comprises a sensor unit disposed adjacent to the power meter unit for monitoring the cyclical property of the indication and generating a consumption detection signal; a processing unit connected to the sensor unit for receiving the consumption detection signal and generating an information signal, the processing unit including a prediction unit for generating values for prediction model parameters for predicting energy consumption data derived from the consumption detection signal and incorporating the values of the prediction model parameters into the information signal; and, a transmitter connected to the processing unit for receiving the information signal and transmitting a transmission signal. The power meter reader system further includes a display unit located remotely with respect to the detection unit. The display unit receives the transmission signal and displays the power consumption of the structure based on the prediction model parameters.

In a further aspect, at least one embodiment described herein provides a detection unit for use with a power meter unit mounted on a structure that is consuming power, the power meter unit including an indication with a cyclical property that varies at a rate indicative of power consumption of the structure. The detection unit is mounted on the power meter unit for monitoring the power consumption and comprises a sensor unit disposed adjacent to the power meter unit for monitoring the cyclical property of the indication and generating a consumption detection signal; and, a processing unit connected to the sensor unit for receiving the consumption detection signal and generating an information signal, the processing unit further generating a sensor enable signal to enable the sensor unit for only a portion of the cyclical property of the indication, the portion coinciding with a time interval indicating the completion of one period of the cyclical property, the time interval being shorter than the period of the cyclical property.

In yet another aspect, at least one embodiment described herein provides a detection unit for use with a power meter unit mounted on a structure that is consuming power, the power meter unit including an indication with a cyclical property having a period that varies at a rate indicative of power consumption of the structure. The detection unit is mounted on the power meter unit for monitoring the power consumption and comprises a sensor unit disposed adjacent to the power meter unit for monitoring the cyclical property of the indication and generating a consumption detection signal; and, a processing unit connected to the sensor unit for receiving the consumption detection signal and generating an information signal, the processing unit including a prediction unit for generating values for prediction model parameters for predicting power consumption data derived from the consumption detection signal and incorporating the values of the prediction model parameters into the information signal.

In another aspect, at least one embodiment described herein provides a method for automatically reading a power meter unit mounted on a structure that is consuming power, the power meter unit including an indication with a cyclical property that varies at a rate indicative of power consumption. The method comprises:

a) sensing values for the cyclical property of the indication using a sensor unit and generating a consumption detection signal;

b) generating an information signal based on data from the consumption detection signal; and, c) generating a sensor enable signal to enable the sensor unit for only a portion of the cyclical property of the indication, the portion coinciding with a time interval indicating the completion of one period of the cyclical property, the time interval being shorter than the period of the cyclical property.

In a still further aspect, at least one embodiment described herein provides a method for automatically reading a power meter unit mounted on a structure that is consuming power, the power meter unit including an indication with a cyclical property having a period that varies at a rate indicative of power consumption of the structure. The method comprises:

a) sensing values for the cyclical property of the indication using a sensor unit and generating a consumption detection signal; and, b) generating an information signal based on data from the consumption detection signal by generating values for prediction model parameters to predict power consumption data derived from the consumption detection signal and including the values of the prediction model parameters in the information signal.

In a still further aspect, at least one embodiment described herein can include a processing unit including a control unit for directing the activity of the processing unit and a tracking unit connected to the control unit for tracking the cyclical property of the indication and for generating a sleep period during which the sensor enable signal disables the sensor unit.

In a still further aspect, at least one embodiment described herein can include a sleep period having a percentage of the last value of the cyclical property of the indication.

In a still further aspect, at least one embodiment described herein can include a sleep period that is adjusted based on a history of values for the cyclical property of the indication.

In a still further aspect, at least one embodiment described herein can include a processing unit further comprising a prediction unit for generating values for prediction model parameters to predict power consumption data derived from the consumption detection signal, and wherein the values of the prediction model parameters are incorporated into the information signal rather raw data in the consumption detection signal.

In a still further aspect, at least one embodiment described herein can include a prediction unit that updates the values of the prediction model parameters when data generated by the prediction model parameters differs from the power consumption data derived from the consumption detection signal by a value greater than a prediction error value.

In a still further aspect, at least one embodiment described herein can include a transmitter that transmits the transmission signal to the display unit every time new values for the prediction model parameters are calculated.

In a still further aspect, at least one embodiment described herein can include a processing unit that further comprises a compression unit for compressing data in the information signal.

In a still further aspect, at least one embodiment described herein can include a detection unit that further comprises a temperature unit for monitoring outdoor temperature and providing a temperature signal to the processing unit, and wherein data from the temperature signal is incorporated into the information signal.

In a still further aspect, at least one embodiment described herein can include a display unit that comprises: a display processing unit for controlling the operation of the display unit; a receiver connected to the display processing unit for receiving and processing the transmission signal to provide a received signal to the display processing unit; a display connected to the display processing unit for displaying information related to power consumption of the structure; and, an interface unit connected to the display processing unit for allowing a user to input information and select modes of operation for the display unit.

In a still further aspect, at least one embodiment described herein can include a display unit that further comprises: a real-time clock connected to the display processing unit for providing time information; a buzzer unit connected to the display processing unit for providing audible information to the user; and, a memory unit connected to the display processing unit for storing information related to power consumption of the structure.

In a still further aspect, at least one embodiment described herein can include a display unit that further comprises a communication unit connected to the display processing unit for providing a connection to an external computing device for uploading the power consumption information and downloading power consumption rates.

In a still further aspect, at least one embodiment described herein can include a display unit that comprises: a display processing unit for controlling the operation of the display unit; a receiver connected to the display processing unit for receiving and processing the transmission signal to provide a received signal to the display processing unit, and, an appliance control unit connected to the display processing unit for controlling at least one appliance in the structure, the appliance control unit receiving at least one of temperature information, power consumption information and time information and generating an appliance control signal for controlling an operational setting of the at least one appliance.

In a still further aspect, at least one embodiment described herein can include a sensor unit that comprises an emitter, a first detector and a second detector, each directed towards a location where the indication appears, the emitter being disposed between the first and second detectors, the emitter being adapted to emit IR energy at the location where the indication appears, and the first and second detectors are adapted to detect a level of IR energy related to the indication, the first and second detectors providing first and second detection signals indicative of the period of the cyclical property of the indication.

In a still further aspect, at least one embodiment described herein can include first and second detection signals that are combined using the logical AND operator to provide the consumption detection signal.

In a still further aspect, at least one embodiment described herein can include first and second detection signals that are combined by subtracting the first and second detection signals from one another.

In a still further aspect, at least one embodiment described herein can include a display unit located remotely with respect to the detection unit, the display unit receiving the transmission signal and displaying the power consumption of the structure based on the prediction model parameters.

In a still further aspect, at least one embodiment described herein can include a processing unit that includes a control unit for directing the activity of the processing unit and a tracking unit connected to the control unit for tracking the cyclical property of the indication and for generating a sleep period during which the sensor unit is disabled, wherein the processing unit provides an enabling value in a sensor enable signal to enable the sensor unit for only a portion of the cyclical property of the indication, the portion coinciding with a time interval indicating the completion of one period of the cyclical property, the time interval being shorter than the period of the cyclical property, otherwise the sensor enable signal being adapted to disable the sensor unit based on the sleep period.

In a still further aspect, at least one embodiment described herein can include a method that further comprises transmitting a transmission signal based on the information signal; and at a remote location relative to the power meter unit, receiving and processing the transmission signal for obtaining power consumption information and, displaying the power consumption information.

In a still further aspect, at least one embodiment described herein can include a method that includes tracking the cyclical property of the indication for generating a sleep period during which the sensor enable signal disables the sensor unit.

In a still further aspect, at least one embodiment described herein can include a method that further comprises generating the sleep period as a percentage of the last value of the cyclical property of the indication.

In a still further aspect, at least one embodiment described herein can include a method that further comprises generating the sleep period based on a history of values for the cyclical property of the indication.

In a still further aspect, at least one embodiment described herein can include a method that further comprises generating values for prediction model parameters to predict power consumption data derived from the consumption detection signal.

In a still further aspect, at least one embodiment described herein can include a method that further includes updating the values for the prediction model parameters when data generated by the prediction model parameters differs from the power consumption data derived from the consumption detection signal by a value greater than a prediction error value.

In a still further aspect, at least one embodiment described herein can include a method that further includes compressing data in the information signal to produce the transmission signal.

In a still further aspect, at least one embodiment described herein can include a method that further includes monitoring outdoor temperature and incorporating temperature data into the information signal.

In a still further aspect, at least one embodiment described herein can include a method that can further include storing information related to the power consumption of the structure and, predicting future power consumption of the structure based on the stored information.

In a still further aspect, at least one embodiment described herein can include a method that further includes providing a connection to an external computing device for uploading the power consumption information and downloading power consumption rates.

In a still further aspect, at least one embodiment described herein can include a method that further comprises generating an appliance control signal for controlling an operational setting of at least one appliance in the structure, the appliance control signal being generated based on at least one of temperature information, power consumption information and time information.

In a still further aspect, at least one embodiment described herein can include a method that further includes transmitting the transmission signal every time new values for the prediction model parameters are calculated.

In a still further aspect, at least one embodiment described herein can include a method that further includes: tracking the cyclical property of the indication for generating a sleep period during which a sensor enable signal disables the sensor unit; and, generating the sleep period during which the sensor unit is disabled by providing an enabling value in the sensor enable signal to enable the sensor unit for only a portion of the cyclical property of the indication, the portion coinciding with a time interval indicating the completion of one period of the cyclical property, the time interval being shorter than the period of the cyclical property, otherwise the sensor enable signal being adapted to disable the sensor unit based on the sleep period.

Finally, it should be understood that various modifications can be made to the embodiments described and illustrated herein, without departing from the scope of these embodiments which are defined in the appended claims. For instance, the display unit need not be installed in the structure that is consuming power since there are some applications in which one display unit can be linked to several detection units so that power consumption of several structures can be monitored from a central location. In this case, the display unit needs to be augmented to recognize the identity of several detection units and keep separate records for each detection unit.

The invention claimed is:

1. A housing for a detection unit for automatically reading a power meter unit mounted on a structure that is consuming power, the power meter unit including an indication with a cyclical property having a period that varies at a rate indicative of power consumption of the structure, the housing comprising:
   a) a main body for housing internal electronics;
   b) an extension member having a head region for housing a sensor unit, the extension member being connected to the main body such that the main body supports the extension member, and the extension member being adjustable for changing the location of the head region relative to the main body; and
   c) an attachment means connected to the main body for mounting the main body on the power meter.

2. The housing of claim 1, wherein the housing comprises an extension means for changing the location of the head region relative to the main body for positioning the sensor unit adjacent to a location where the indication appears.

3. The housing of claim 2, wherein the extension means comprises an extension support member coupled to the main body having a socket sized to receive one end of the extension member, and a latch operatively coupled to the extension support member, the latch having an open position to allow for extension of the extension member and a closed position for maintaining the extension member in a fixed position.

4. The housing of claim 2, wherein the extension means comprises a slot on the extension member at the end opposite the head region, the slot having a length to allow for extension of the extension member, a borehole on a corresponding portion of the main body, and a fastener that engages the slot and the borehole for holding the extension member in a fixed position.

5. The housing of claim 1, wherein the extension member further includes a pivot means for positioning the extension member at a desired angle with respect to the main body.

6. The housing of claim 5, wherein the pivot means comprises a slot on the extension member at the end opposite the head region, a borehole on a corresponding portion of the main body, and a fastener that engages the slot and the borehole for holding the extension member in a fixed position.

7. The housing of claim 5, wherein the pivot means comprises an extension support member having a socket with a width larger than the width of the extension member, and a latch operatively coupled to the extension support member, the latch having an open position to allow the extension member to be pivoted and a closed position for maintaining the extension member in a fixed position.

8. The housing of claim 1, wherein the attachment means comprises a clamping means, and the main body comprises at least one loop member, wherein, in use, the clamping means slideably engages the loop member and extends around the perimeter of the power meter.

9. The housing of claim 1, wherein the housing further comprises an extension support member having a socket sized to releasably receive the extension member, and wherein the extension member is removable for configuring the housing in one of a projected configuration and a folded configuration, wherein in the projected configuration the extension member is oriented for directing the sensor unit towards the face of the power meter unit when the indication is directed outwardly towards the face of the power meter unit, and in the folded configuration the extension member is oriented on an inner surface of the housing for directing the sensor unit towards a region on the periphery of the power meter unit when the indication is directed outwardly towards the periphery of the power meter unit.

10. The housing of claim 9, wherein the inner surface of the housing further comprises a recess for receiving the extension member in the folded configuration.

11. The housing of claim 1, wherein the sensor unit is adapted to monitor the cyclical property of the indication and generate a consumption detection signal, and the detection unit further comprises a processing unit connected to the sensor unit for receiving the consumption detection signal and generating an information signal, the processing unit including a prediction unit for generating values for prediction model parameters for predicting data in the consumption detection signal and incorporating the values of the prediction model parameters into the information signal.

12. A housing for a detection unit that is used to read a power meter unit mounted on a structure that is consuming power, the power meter unit including an indication with a cyclical property having a period that varies at a rate indicative of power consumption of the structure, the housing comprising:
   a) a main body for housing internal electronics;
   b) an extension member having a head region for housing at least a portion of the sensor unit and being releasably connectable to the main body such that the main body supports the extension member; and
   c) an attachment means connected to the main body for mounting the main body on the power meter,
wherein the extension member is connectable to the main body in one of a projected configuration, and a folded configuration to accommodate different power meter units having different locations for the indication.

13. The housing of claim 12, wherein in the projected configuration the extension member is connected to the main body to extend across the face of the power meter unit when the indication is directed outwardly toward the face of the power meter unit, and the extension member comprises an extension means for extending the location of the head portion for positioning the sensor unit adjacent to a location where the indication appears.

14. The housing of claim 13, wherein the extension means comprises an extension support member having a socket sized to receive one end of the extension member, and a latch operatively coupled to the extension support member, the latch having an open position to allow for extension of the extension member and a closed position for maintaining the extension member in a fixed position.

15. The housing of claim 13, wherein the extension means comprises a slot on the extension member at the end opposite the head region, the slot having a length to allow for extension of the extension member, a borehole on a corresponding portion of the main body, and a fastener that engages the slot and the borehole for holding the extension member in a fixed position.

16. The housing of claim 12, wherein the extension member further includes a pivot means for positioning the extension member at a desired angle with respect to the main body.

17. The housing of claim 16, wherein the pivot means comprises a slot on the extension member at the end opposite the head region, a borehole on a corresponding portion of the main body, and a fastener that engages the slot and the borehole for holding the extension member in a fixed position.

18. The housing of claim 16, wherein the pivot means comprises an extension support member having a socket with a width larger than the width of the extension member, and a latch operatively coupled to the extension support member, the latch having an open position to allow the extension member to be pivoted and a closed position for maintaining the extension member in a fixed position.

19. The housing of claim 12, wherein the attachment means comprises a clamping means, and the main body comprises at least one loop member, wherein, in use, the clamping means slideably engages the loop member and extends around the perimeter of the power meter.

20. The housing of claim 12, wherein the housing further comprises an extension support member having a socket sized to releasably receive the extension member, and in the folded configuration the extension member is located along an inner surface of the housing for directing the sensor unit towards a region on the periphery of the power meter when the indication is directed outwardly toward the periphery of the power meter unit.

21. The housing of claim 20, wherein the inner surface of the housing further comprises a recess for receiving the extension member in the folded configuration.

22. A housing for a detection unit that is used to read a power meter unit mounted on a structure that is consuming power, the power meter unit including an indication with a cyclical property having a period that varies at a rate indicative of power consumption of the structure, the housing comprising:
    a) a main body for housing internal electronics;
    b) an extension member having a head region for housing at least a portion of the sensor unit and being releasably connectable to the main body such that the main body supports the extension member;
    c) an attachment means connected to the main body for mounting the main body on the power meter;
    d) means for extending the location of the head region with respect to the main body to move the head region across a face of the power meter unit;
    e) means for pivoting the location of the head region with respect to the main body to move the head region across the face of the power meter unit; and
    f) means for configuring the housing in a folded configuration for directing the sensor unit towards the periphery of the power meter when the indication is facing the periphery of the power meter.

\* \* \* \* \*